US012686922B2

(12) United States Patent　　　　(10) Patent No.:　US 12,686,922 B2
Kim et al.　　　　　　　　　　　　　(45) Date of Patent:　Jul. 21, 2026

(54) SUBSTRATE PROCESSING APPARATUS

(71) Applicant: WONIK IPS CO., LTD.,
　　　　　　　Pyeongtaek-si Gyeonggi-do (KR)

(72) Inventors: Tae Dong Kim, Osan-si Gyeonggi-do
　　　　　　　(KR); Jung Hwan Lee, Osan-si
　　　　　　　Gyeonggi-do (KR); **Cheong Hwan
　　　　　　　Jeong**, Anseong-si Gyeonggi-do (KR);
　　　　　　　Sung Ho Roh, Yongin-si Gyeonggi-do
　　　　　　　(KR); Young Jun Kim, Pyeongtaek-si
　　　　　　　Gyeonggi-do (KR); Moon Chul Kum,
　　　　　　　Gwangmyeong-si Gyeonggi-do (KR);
　　　　　　　Chan Soo Park, Osan-si Gyeonggi-do
　　　　　　　(KR); Mi Sook Kim, Yongin-si
　　　　　　　Gyeonggi-do (KR); Yong Ki Kim,
　　　　　　　Hwaseong-si Gyeonggi-do (KR)

(73) Assignee: WONIK IPS CO., LTD.,
　　　　　　　Pyeongtaek-si (KR)

( * ) Notice:　Subject to any disclaimer, the term of this
　　　　　　　patent is extended or adjusted under 35
　　　　　　　U.S.C. 154(b) by 687 days.

(21) Appl. No.: 17/901,487

(22) Filed:　　Sep. 1, 2022

(65)　　　　　Prior Publication Data

US 2023/0070804 A1　　Mar. 9, 2023

(30)　　　　Foreign Application Priority Data

Sep. 2, 2021　(KR) ........................ 10-2021-0117026
　Sep. 2, 2021　(KR) ........................ 10-2021-0117027
　　　　　　　　　(Continued)

(51) Int. Cl.
　　*C23C 16/40*　　　　(2006.01)
　　*C23C 16/44*　　　　(2006.01)
　　　　　　　　(Continued)

(52) U.S. Cl.
　　CPC .... *C23C 16/45557* (2013.01); *C23C 16/4412*
　　　　　　(2013.01); *C23C 16/45563* (2013.01); *C23C
　　　　　　　　　　　　　　　　　*16/4586* (2013.01)

(58) Field of Classification Search
　　CPC .......... C23C 16/45557; C23C 16/4412; C23C
　　　　　　　　　　16/45563; C23C 16/4586; C23C
　　　　　　　　　　　　　16/45565; Y02P 70/50
　　　　　　　　　　(Continued)

(56)　　　　　　References Cited

U.S. PATENT DOCUMENTS 6,056,823　A　*　5/2000　Sajoto ................. C23C 16/4409
　　　　　　　　　　　　　　　　　　　　　　118/715
　6,066,209　A　*　5/2000　Sajoto ................. C23C 16/4409
　　　　　　　　　　　　　　　　　　　　　　118/724
　　　　　　　　　　(Continued)

FOREIGN PATENT DOCUMENTS

CN　　　102286730　A　　12/2011
　JP　　　2001323377　A　　11/2001
　　　　　　　　　　(Continued)

OTHER PUBLICATIONS

Machine Translation for JP2011-9299 (Year: 2025).*

*Primary Examiner* — Rudy Zervigon
(74) *Attorney, Agent, or Firm* — WILLIAM PARK AND
ASSOCIATES LTD.

(57)　　　　　　　ABSTRACT

The present invention disclosed herein relates to a substrate
processing apparatus, and more particularly, to a substrate
processing apparatus in which a substrate is processed at a
high pressure and a low pressure. The present invention
discloses a substrate processing apparatus including: a pro-
cess chamber (100) which has an inner space and in which
an installation groove (130) is defined at a central side on a
bottom surface (120); a substrate support (200) installed to
be inserted into the installation groove (130) and having a
top surface on which the substrate is seated; an inner lid part
　　　　　　　　　　(Continued)

(300) which is installed to be movable vertically in the inner space and descends so that a portion thereof is in close contact with the bottom surface (120) adjacent to the installation groove (130) to define a sealed processing space (S2) in which the substrate support (200) is disposed therein.

19 Claims, 12 Drawing Sheets

(30) Foreign Application Priority Data

| Sep. 6, 2021 | (KR) | ........................ 10-2021-0118316 |
| Aug. 11, 2022 | (KR) | ........................ 10-2022-0100376 |

(51) Int. Cl.
  *C23C 16/455*     (2006.01)
  *C23C 16/458*     (2006.01)
(58) Field of Classification Search
  USPC ........................ 118/715; 156/345.33, 345.34
  See application file for complete search history.

(56) References Cited

U.S. PATENT DOCUMENTS

| 6,077,562 A * | 6/2000 | Dornfest ............. C23C 16/4409 |
| | | 117/88 |
| 6,165,271 A * | 12/2000 | Zhao ................... C23C 16/4409 |
| | | 118/724 |
| 6,258,170 B1 * | 7/2001 | Somekh .............. C23C 16/4409 |
| | | 392/394 |
| 6,635,114 B2 * | 10/2003 | Zhao ................... C23C 16/4402 |
| | | 118/726 |
| 6,740,853 B1 * | 5/2004 | Johnson ............ H01L 21/67109 |
| | | 219/443.1 |
| 7,090,727 B2 * | 8/2006 | Carpenter ............. C23C 16/455 |
| | | 118/724 |
| 7,794,546 B2 * | 9/2010 | Li ........................ C23C 16/4401 |
| | | 156/345.31 |
| 8,211,232 B2 * | 7/2012 | Hayashi .................. C23C 16/54 |
| | | 118/724 |
| 2001/0027843 A1 | 10/2001 | Komino et al. |
| 2003/0024900 A1 * | 2/2003 | Johnson ............ H01J 37/32568 |
| | | 118/712 |
| 2003/0033978 A1 * | 2/2003 | Zhao ................... C23C 16/4481 |
| | | 118/724 |
| 2003/0033984 A1 * | 2/2003 | Carpenter ............. C23C 16/455 |
| | | 118/725 |
| 2003/0209324 A1 | 11/2003 | Fink |
| 2004/0134427 A1 * | 7/2004 | Derderian ........... H01J 37/3244 |
| | | 118/715 |
| 2006/0065635 A1 * | 3/2006 | Derderian ......... H01J 37/32477 |
| | | 216/89 |
| 2009/0246374 A1 * | 10/2009 | Vukovic ........... C23C 16/45563 |
| | | 427/255.28 |
| 2010/0043975 A1 * | 2/2010 | Hayashi .............. H01J 37/3244 |
| | | 156/345.33 |
| 2010/0243166 A1 * | 9/2010 | Hayashi ............ H01J 37/32568 |
| | | 156/345.34 |
| 2011/0308458 A1 | 12/2011 | Sung et al. |
| 2019/0096716 A1 | 3/2019 | Iwasaka et al. |
| 2019/0198297 A1 | 6/2019 | Aramaki et al. |
| 2019/0279884 A1 | 9/2019 | Yamashita et al. |
| 2021/0166940 A1 | 6/2021 | Nozawa |
| 2023/0335377 A1 * | 10/2023 | Subramani ......... C23C 16/4557 |

FOREIGN PATENT DOCUMENTS

| JP | 2008525999 A | 7/2008 | |
| JP | 2008305793 A | 12/2008 | |
| JP | 2010040534 A | 2/2010 | |
| JP | 2011009299 * | 1/2011 | .......... H01L 21/304 |
| JP | 2011009299 A | 1/2011 | |
| JP | 2011502361 A | 1/2011 | |
| JP | 2012256942 A | 12/2012 | |
| JP | 2013151720 A | 8/2013 | |
| JP | 2015026693 A | 2/2015 | |
| JP | 2015216269 A | 12/2015 | |
| JP | 2018157234 A | 10/2018 | |
| JP | 2019140146 A | 8/2019 | |
| KR | 1020030011399 A | 2/2003 | |
| KR | 1020040082170 A | 9/2004 | |
| KR | 1020070087196 A | 8/2007 | |
| KR | 1020110139079 A | 12/2011 | |
| KR | 1020160094424 A | 8/2016 | |
| KR | 1020180004002 A | 1/2018 | |
| KR | 1020210045294 A | 4/2021 | |
| KR | 102310823 B1 | 10/2021 | |

* cited by examiner

— : Pressure in processing space (S2)
(0.01 Torr ~ 5Bar)

--- : Pressure in non-processing space (S1)
(0.01 Torr ~ ATM)

SUBSTRATE LOADING PROCESS — S100

PROCESSING SPACE FORMING PROCESS — S200

SUBSTRATE PROCESSING PROCESS — S300

PROCESSING SPACE RELEASING PROCESS — S400

SUBSTRATE UNLOADING PROCESS — S500

S300

<u>S400</u>

SUBSTRATE PROCESSING APPARATUS

CROSS-REFERENCE TO RELATED APPLICATIONS

This U.S. non-provisional patent application claims priority under 35 U.S.C. § 119(a) to Korean Patent Application No. 10-2021-0117026, filed on Sep. 2, 2021, Korean Patent Application No. 10-2021-0117027, filed on Sep. 2, 2021, Korean Patent Application No 10-2021-0118316, filed on Sep. 6, 2021, and Korean Patent Application No. 10-2022-0100376, filed on Aug. 11, 2022, in the Korean Intellectual Property Office, the entire contents of which are hereby incorporated by reference.

FIELD OF THE INVENTION

The present invention disclosed herein relates to a substrate processing apparatus, and more particularly, to a substrate processing apparatus in which a substrate is processed at a high pressure and a low pressure.

BACKGROUND ART

The substrate processing apparatus may perform a process of processing a substrate such as a wafer, in general, perform etching, deposition, heat treatment, and the like on the substrate.

Here, when a film is formed on the substrate through the deposition, a process of removing impurities within the film and improving characteristics of the film after forming the thin film on the substrate is being required.

Particularly, as 3D semiconductor devices and substrates having a high aspect ratio appear, since a deposition temperature is lowered to meet a step coverage standard, or a gas having a high impurity content is inevitably used, the removing of the impurities within the film is becoming more difficult.

Accordingly, there is a need for a substrate processing method, which is capable of improving the characteristics of the thin film by removing the impurities existing in the thin film without deterioration in characteristics of the thin film after forming the thin film on the substrate, and an apparatus for processing the substrate, which performs the method.

In addition, there is a limitation that the deposited thin film is contaminated by a small amount of impurities, which remain in a chamber as well as the thin film on the substrate, and thus, it is necessary to remove the impurities from the inside of the chamber including a substrate support that supports the substrate.

To improve this limitation, Korean Patent Application No. 10-2021-0045294A, which is the related art, disclosures a substrate processing method, in which high-pressure and low-pressure atmospheres are repeatedly formed to reduce imperfection on a surface of a substrate and the inside of a chamber, thereby improving characteristics of a thin film.

However, when the above-described substrate processing method is applied to the substrate processing apparatus according to the related art, the volume of the processing space for processing the substrate is relatively large, and thus a fast pressure change rate may not be realized. As a result, there is a limitation in that it is not possible to implement a process that repeatedly performs a wide pressure range from about 0.01 Torrs, which is a low pressure, to about 5 Bars, which is a high pressure, within a short time.

To solve this limitation, a volume of the processing space may be minimized in the substrate processing apparatus according to the related art, but there is a limitation in that a dead volume still increases due to a configuration of the gas supply part for supplying a process gas into the processing space.

In addition, since the gas supply part has to be separately installed while minimizing the volume in the limited processing space, the gas supply part may be disposed at a position adjacent to the substrate support. Thus, the process gas may be supplied from an edge of the substrate to a center of the substrate, and thus, there is a limitation in that uniform substrate processing is not performed because the process gas is not transferred.

Particularly, in the substrate processing apparatus according to the related art, a pumping passage for exhausting the processing space is provided between the substrate support and the gas supply part, and thus, there is a limitation that the process gas is not transferred to the center of the substrate.

In addition, as the substrate processing apparatus according to the related art performs substrate processing through a repeated pressure change between high and low pressures, it is easy to damage sealing for the sealed processing space, and thus, the process gas therein leaks under a high pressure environment, or external impurities is easily introduced under a low pressure environment.

In addition, the substrate processing apparatus according to the related art has a limitation in that the exhaust of the processing space, in which a pressure is repeatedly changed from a high pressure to a low pressure, is performed in a simple line, and thus, an external vacuum pump connected to the outside is exposed to be damaged, thereby deteriorating durability.

In addition, as the processing space is minimized, there is a limitation in that it is difficult to load and unload the substrate, resulting in a difficult to transfer the substrate.

However, when the corresponding process is performed through the substrate processing apparatus according to the related art, as the pressure in the processing space in which the substrate is processed is rapidly changed, a temperature change occurs, and thus, as such a temperature change is not actively controlled, there is a limitation in that completeness of substrate processing is deteriorated.

More specifically, when the substrate is heated through the substrate support supporting the substrate, there are limitations in that heat transfer efficiency is deteriorated due to indirect contact between a processing surface of the substrate and a heater, a heat loss occurs due to proximity between the substrate support and a bottom surface of the process chamber, a temperature of the substrate is not controlled in response to the rapidly changing temperature due to characteristics of the installed heater.

SUMMARY OF THE INVENTION

To solve the above-mentioned limitations, an object of the present invention is to provide a substrate processing apparatus, which is capable of smoothly supplying a gas up to a central side of a substrate.

In accordance with an embodiment of the present invention, a substrate processing apparatus includes: a process chamber 100 which has an inner space and in which an installation groove 130 is defined at a central side on a bottom surface 120; a substrate support 200 installed to be inserted into the installation groove 130 and having a top surface on which the substrate is seated; an inner lid part 300 which is installed to be movable vertically in the inner space and descends so that a portion thereof is in close contact with the bottom surface 120 adjacent to the installation groove 130 to divide the inner space into a sealed processing space S2 defined therein and other non-processing space S1; and an inner lid driving part 600 installed to pass through an upper portion of the process chamber 100 to drive the vertical movement of the inner lid part 300, wherein the inner lid part 300 includes an inner lid 310 that is movable vertically in the inner space and a gas supply passage 320 provided to communicate with the processing space S2 inside the inner lid 310.

The substrate processing apparatus may further include a gas supply part 410 disposed under the inner lid part 300 to inject the process gas transferred through the gas supply passage 320 to the processing space S2.

The gas supply part 410 may include an injection plate 412 disposed under the inner lid part 300 and provided with a plurality of injection holes 411.

The gas supply part 410 may include an injection plate support 413 that supports an edge of the injection plate 412 and is coupled to a bottom surface of the inner lid part 300.

The gas supply part 410 may further include a plurality of coupling members 414 passing through the injection plate support 413 and coupled to the inner lid part 300.

The injection plate 412 may be disposed to be spaced downward from the inner lid part 300 to define a diffusion space S3 in which the process gas is diffused between the injection plate 412 and the inner lid part 300.

The injection plate 412 may be made of a metal or quartz material.

The injection plate support 413 may protrude toward a center on an inner surface and may include a support stepped part 415 on which an edge of a bottom surface of the injection plate 412 is seated.

The inner lid 310 may include an insertion installation groove 330 in which at least a portion of the gas supply part 410 is inserted and installed on the bottom surface thereof.

The insertion installation groove 330 may have an inner surface with an inclination that gradually increases from an edge to a central side.

The gas supply part 410 may have a bottom surface that defines a plane with the bottom surface of the inner lid 310 in a state of being inserted and installed in the insertion installation groove 330.

The inner lid 310 may have a gas introduction groove 340 connected to an end of the gas supply passage 320 on the center side of the bottom surface.

The gas supply part 410 may further include a diffusion member inserted into the gas introduction groove 340 to diffuse the supplied process gas.

The diffusion member may have an inclined surface on a side surface thereof to gradually increase in height toward the center.

The process chamber 100 may include a gas introduction passage 190 provided to transfer the process gas introduced from the outside to a bottom surface that is in contact with the inner lid part 300, and the inner lid part 300 may descend to be in close contact with the bottom surface 120 so as to connect the gas introduction passage 190 to the gas supply passage 320, thereby supply the process gas to the gas supply passage 320.

The gas supply passage 320 may include a vertical supply passage that is provided at a position corresponding to the gas introduction passage 190 at the edge side of the inner lid 310 and is connected to the gas introduction passage 190, and a horizontal supply passage 322 provided from the vertical supply passage 321 toward the center of the inner lid 310.

The substrate processing apparatus may further include: a processing space pressure adjusting part 400 communicating with the processing space S2 and configured to adjust a pressure of the processing space S2; a non-processing space pressure adjusting part 500 communicating with the non-processing space S1 and configured to adjust a pressure of the non-processing space S1 independently of the processing space S2; and a controller configured to control the pressure adjusting of the processing space S2 and the non-processing space S1 through the processing space pressure adjusting part and the non-processing space pressure adjusting part 500.

The processing space pressure adjusting unit 400 may include a gas supply part 410 configured to supply the process gas to the processing space S2 and a gas exhaust part 420 configured to exhaust the processing space S2, and the non-processing space pressure adjusting part 500 may include a non-processing space gas exhaust part 520 connected to a gas exhaust port 180 provided on one surface of the process chamber 100 to exhaust the non-processing space S1, and a non-processing space gas supply part 510 connected to a gas supply port 170 provided on the other surface of the process chamber 100 to supply a filling gas to the non-processing space S1.

The controller may control, before the inner lid part 300 ascends, at least one of the processing space pressure adjusting part 400 or the non-processing space pressure adjusting part 500 so that the pressures of the processing space S2 and the non-processing space S1 are the same.

The controller may change the pressure of the processing space S1, in which the substrate 1 is seated on perform the substrate processing, between a first pressure higher than a normal pressure and a second pressure lower than the normal pressure through the processing space pressure adjusting part 400.

The controller may maintain the pressure in the non-processing space S1 in a vacuum state while the substrate processing is performed through the non-processing space pressure adjusting part 500.

The controller may maintain the pressure in the non-processing space S1 to a pressure lower than the pressure in the processing space S2 while the substrate processing is performed through the non-processing space pressure adjusting part 500.

The controller may fall the pressure of the processing space S2 from the first pressure to the normal pressure through the processing space pressure adjusting part 400 and fall the pressure of the processing space S2 side by side from the normal pressure to the second pressure that is in a vacuum state.

The controller may sequentially and repeatedly change the pressure of the processing space S2 several times from the first pressure to the second pressure and then to first pressure through the processing space pressure adjusting part 400 so as to perform the substrate processing.

The substrate processing may include a temperature adjusting part 1100 installed in the inner lid part 300 to adjust a temperature of the substrate 1 disposed in the processing space S2.

The substrate support 200 may include: a substrate support plate 210 on which the substrate 1 is seated on a top surface; a substrate support post 220 passing through the bottom of the installation groove 130 so as to be connected to the substrate support plate 210; and an internal heater 230 installed inside the substrate support plate 210.

The temperature adjusting part 1100 may include: a temperature adjusting plate 1110 installed in the inner lid part 300 to heat or cool the substrate 1; and a rod part 1120 passing through the top lid 140 so as to be coupled to the temperature adjusting plate 1110.

The temperature adjusting plate 1110 may be installed in a through-hole 350 defined in a central side of the inner lid part 300 corresponding to the substrate 1.

The temperature adjusting part 1100 may further include a buffer plate 530 coupled to the through-hole 350 at the lower side of the inner lid part 300 to cover the temperature adjusting plate 1110.

The temperature adjusting part 1100 may further include a cover plate 1140 installed to cover the through-hole 350 at an upper side of the inner lid part 300.

The temperature adjusting plate 1110 may be installed at a position opposite to the substrate 1 on the bottom surfaces of the inner lid part 300.

The temperature adjusting part 1100 may be a halogen or LED heater configured to heat the substrate 1.

The temperature adjusting plate 1110 may be installed to be inserted into an insertion groove 360 defined at the central side of the top surface of the inner lid part 300 corresponding to the substrate 1.

The temperature adjusting plate 1110 may include at least two temperature adjusting areas that are separated from each other on a plane and are independently adjustable in temperature.

The temperature adjusting areas may include: a first temperature adjusting area 1111 that shares a center with the planar circular temperature adjusting plate 1110 and is divided into a planar circular shape at a position corresponding to the central side of the substrate 1; a third temperature adjusting area 1113 separated from an edge of the temperature adjusting plate 1110; and a second temperature adjusting area 1112 divided between the first temperature adjusting area 1111 and the third temperature adjusting area 1113 area.

The substrate processing apparatus may further include a temperature controller for controlling the heating or cooling of the temperature adjusting part 1100, wherein the temperature controller the third temperature adjusting area 1113 to have a temperature higher than that of the first temperature adjusting area 1111.

The substrate processing apparatus may further include a temperature controller for controlling the heating or cooling of the temperature adjusting part 1100, wherein the temperature controller may control the temperature adjusting part 1100 so that the temperature of the substrate 1 or the processing space S2 is constantly maintained while a pressure of the processing space S2 is changed.

A substrate processing method according to the present invention, which processes a substrate using a substrate processing apparatus including a process chamber 100 which defines an inner space and on which a gate 111 is provided at one side, a substrate support 200 having a top surface on which a substrate 1 is seated, and an inner lid part 300 that is opposite to the substrate support 200 and is installed to be vertically movable in the inner space, the substrate processing method includes: a substrate loading process (S100) of loading the substrate 1 into the inner space through the gate 111 by a transfer robot provided at the outside; a processing space forming process (S200) of allowing a portion of the inner lid part 300 to descend so as to be in close contact with a bottom surface 120 of the process chamber in a state in which the substrate 1 is seated on the substrate support 200 through the substrate loading process (S100), thereby dividing the inner space into a sealed processing space S2 and other non-processing space S1; and a substrate processing process (S300) of performing substrate processing on the substrate 1 disposed in the processing space S2.

The substrate processing method may further include: after the substrate is processed through the substrate processing process (S300), a processing space releasing process (S400) of allowing the inner lid part 300 to ascend so as to release the sealed processing space S2; and a substrate unloading process (S500) of unloading the processed substrate 1 by the transfer robot, which is disposed at the outside, from the inner space to the outside.

The substrate loading process (S100), the processing space forming process (S200), the substrate processing process (S300), the processing space releasing process (S400), and the substrate unloading process (S500) may be sequentially and repeatedly performed several times.

The substrate processing method may further include, before the substrate 1 is loaded into the inner space through the substrate loading process (S100), a cleaning process of supplying a gas through a side of the processing space S2 in the state in which the inner lid part 300 ascends to exhaust the gas through a side of the non-processing space S1.

The substrate processing process (S300) may include: a pressure rising process (S310) of raising a pressure in the processing space S2 to a first pressure higher than a normal pressure, and a pressure falling process (S320) of falling the pressure of the processing space S2 from the first pressure to a second pressure.

The second pressure may be a pressure lower than the normal pressure.

The pressure falling process (S320) may include: a first pressure falling process (S321) of falling the pressure of the processing space S2 from the first pressure to the normal pressure, and a second pressure falling process (S322) of falling the pressure of the processing space S2 from the normal pressure to the second pressure lower than the normal pressure.

In the substrate processing process (S300), a pressure of the non-processing space S1 may be constantly maintained at a vacuum pressure lower than the normal pressure.

The processing space releasing process (S400) may include: a pressure adjusting process (S410) of adjusting a pressure of at least one of the non-processing space S1 or the processing space S2 to adjust a pressure difference between the non-processing space S1 and the processing space S2 to a pressure within a preset range; and an inner lid ascending process (S420) of allowing the inner lid part 300 to ascend so as to release the processing space S2.

In the pressure adjusting process (S410), the pressures of the non-processing space S1 and the processing space S2 may be adjusted to be equal to each other.

The process chamber 100 may further includes a gate valve 150 configured to open and close the gate 111, wherein the substrate processing method may further include, after the processing space forming process (S200), a gas closing process of closing the gate 111 through the gate valve 150 to seal the inner space.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Hereinafter, a substrate processing apparatus according to the present invention will be described with reference to the accompanying drawings.

Figure 1:
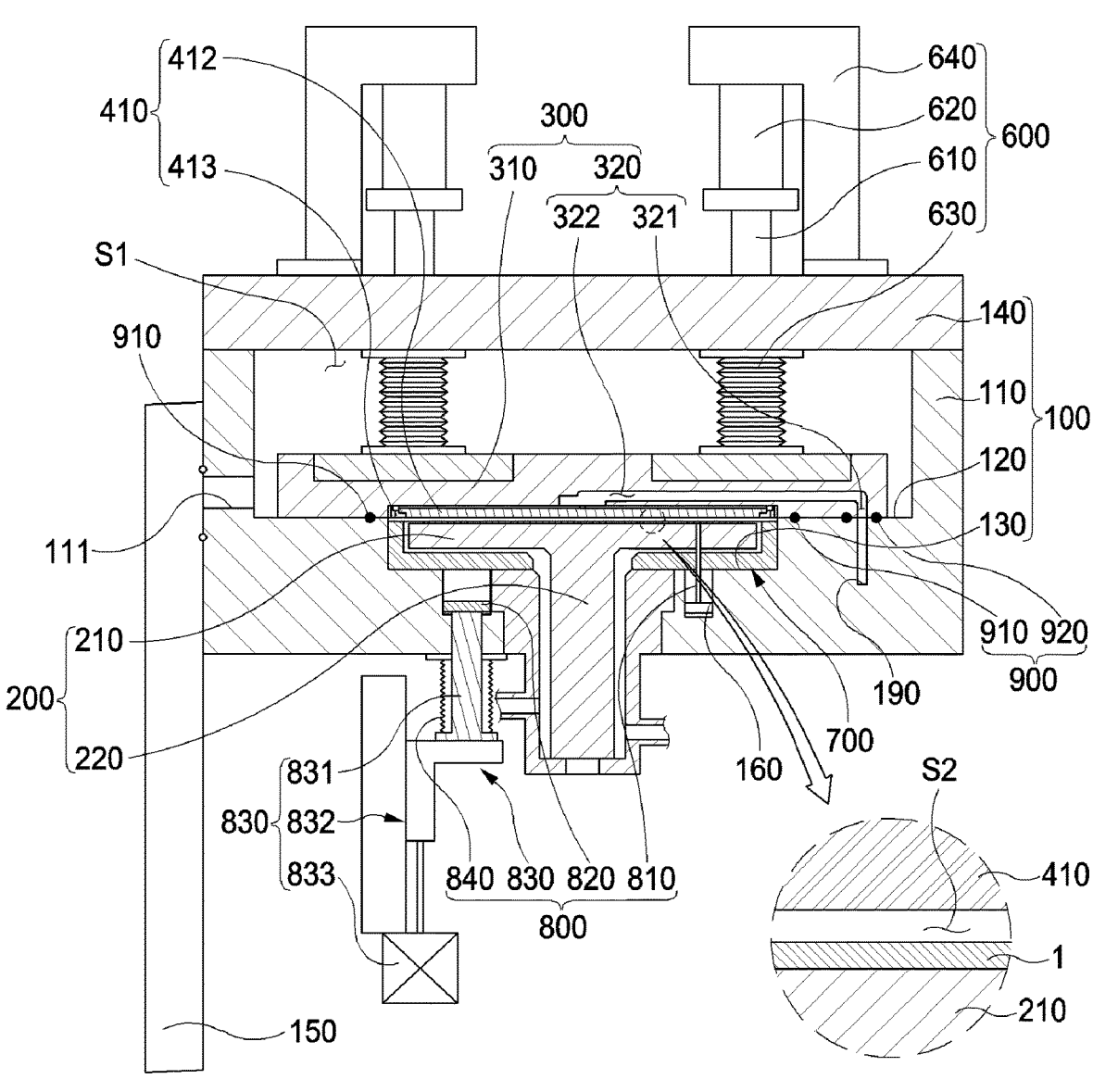
FIG. 1 is a cross-sectional view illustrating a substrate processing apparatus according to the present invention.

As illustrated in FIG. 1, a substrate processing apparatus according to the present invention may include: a process chamber 100 including a chamber body 110 which has an opened upper portion, in which an installation groove 130 is defined at a central side of a bottom surface 120 thereof, and which includes a gate 111 configured to load/unload a substrate 1 is disposed at one side thereof, and a top lid 140 coupled to the upper portion of the chamber body 110 to define a non-processing space S1; a substrate support 200 installed to be inserted into the installation groove 130 and having a top surface on which the substrate 1 is seated; an inner lid part 300 which is installed to be vertically movable in the non-processing space S1 and of which a portion is in close contact with the bottom surface 120 adjacent to the installation groove 130 through descending to define a sealed processing space S2 in which the substrate support 200 is disposed; and an inner lid driving part 600 installed to pass through an upper portion of the process chamber 100 and configured to drive the vertical movement of the inner lid part 300.

In addition, the substrate processing apparatus according to the present invention may include: a processing space pressure adjusting part 400 communicating with the processing space S2 and configured to adjust a pressure of the processing space S2; and a non-processing space pressure adjusting part 500 communicating with the non-processing space S1 and configured to adjust a pressure of the non-processing space S1 independently of the processing space S2.

In addition, the substrate processing apparatus according to the present invention may further include a controller configured to control the pressures of the processing space S2 and the non-processing space S1 through the processing space pressure adjusting part 400 and the non-processing space pressure adjusting part 500.

In addition, the substrate processing apparatus according to the present invention may include a charging member 700 installed between an inner surface of support 200 and installation groove 130 to occupy at least a portion of a space between support 200 and inner surface of the installation groove 130.

In addition, the substrate processing apparatus according to the present invention may further include a substrate support pin part 800 configured to support the substrate 1 loaded into and unloaded from the process chamber 100 and seated on the substrate support 200.

In addition, the substrate processing apparatus according to the present invention may include a temperature adjusting part 1100 installed in the inner lid part 300 to adjust a temperature of the substrate 1 disposed in the processing space S2.

Here, the substrate 1 to be processed may be understood to include all substrates such as substrates used in display devices such as LCD, LED, and OLED, semiconductor substrates, solar cell substrates, glass substrates, and the like.

The process chamber 100 may have a configuration in which the inner space is defined therein and thus may have various configurations.

For example, the process chamber 100 may include the chamber body 110 having the opened upper portion and the top lid 140 covering the opened upper portion of the chamber body 110 to define the sealed non-processing space S1 together with the chamber body 110.

In addition, the process chamber 100 may include the bottom surface 120 defining the bottom of the inner space and the installation groove 130 defined in the bottom surface 120 to install the substrate support 200.

In addition, the process chamber 100 may further include a gate valve 150 for opening and closing a gate 111 provided at one side of the chamber body 110 to load and unload the substrate 1.

In addition, the process chamber 100 may further include a support pin installation groove 160 defined in a bottom surface of the substrate support 200 to be described later to install a substrate support ring 820.

In addition, the process chamber 100 may include a gas introduction passage 190 provided to transfer the process gas introduced from the outside to a bottom surface that is in contact with the inner lid part 300.

In addition, the process chamber 100 may further include a gas supply port 170 having one side to which a non-processing space gas supply part 510 to be described later is connected to supply a filling gas to the non-processing space S1.

In addition, the process chamber 100 may further include a gas exhaust port 180 having the other side to which a non-processing space gas exhaust part 520 is connected to exhaust the non-processing space S1.

The chamber body 110 may have an opened upper portion to define the sealed non-processing space S1 together with the top lid 140 to be described later.

Here, the chamber body 110 may be made of a metal material including aluminum. As another example, the chamber body 110 may be made of a quartz material and may have a rectangular parallelepiped shape like the chamber that is disclosed in the related art.

The top lid 140 may be coupled to the upper side of the chamber body 110 having the opened upper portion and may be configured to define the sealed non-processing space S1 together with the chamber body 110.

Here, the top lid 140 may be provided in a rectangular shape on a plane to correspond to the shape of the chamber body 110 and may be made of the same material as the chamber body 110.

In addition, the top lid 140 may have a plurality of through-holes so that the inner lid driving part 600 to be described later is installed to pass therethrough, and an end of a first bellows 630 to be described later may be coupled to the top lid 140 to prevent various gases and foreign substances from leaking.

The configuration of the top lid 140 may be omitted, and the chamber body 110 may be integrally provided to define the sealed non-processing space S1 therein.

The process chamber 100 may include the bottom surface 120, of which an inner bottom surface defines the bottom of the non-processing space S1, and the installation groove 130 defined to install the substrate support 200.

More specifically, as illustrated in FIG. 1, in the process chamber 100, the installation groove 130 may be defined with a height difference at a central side of the bottom surface to correspond to the substrate support 200 to be described later, and the bottom surface 120 may be defined on an edge of the installation groove 130.

That is, in the process chamber 100, the installation groove 130 for installing the substrate support 200 may be defined with the height difference in the inner bottom surface, and the other portion may be defined as the bottom surface 120 at a height higher than the installation groove 130.

The gate valve 150 may have a configuration for opening and closing the gate 111 disposed at one side of the chamber body 110 to load and unload the substrate 1 and may have various configurations.

Here, the gate valve 150 may be in close contact with or released from the chamber body 110 through vertical driving and forward/backward driving to open or close the gate 111. For another example, the gate valve 150 may open or close the gate 111 through single driving in a diagonal direction. In this process, various types of driving methods disclosed in the related art, such as a cylinder, a can, an electromagnetism, and the like may be applied.

The support pin installation groove 160 may have a configuration for installing the substrate support 200 that supports the substrate 1 and is seated on the substrate support 200 or spaced upward from the substrate support 200 to support the substrate 1 to load or unload the substrate 1 and may have various configurations.

For example, the support pin installation groove 160 may be provided as a planar annular groove corresponding to the substrate support ring 820 so that a substrate support ring 820 to be described later is installed.

Here, the support pin installation groove 160 may be installed to correspond to a position at which the substrate support ring 820 is installed on the bottom surface of the process chamber 100, and more specifically, may be defined in the installation groove 130.

That is, the support pin installation groove 160 may be defined in the installation groove 130 defined with the height difference from the bottom surface 120 and may have a predetermined depth so that the substrate support ring 820 is movable vertically in the installed state.

Thus, in the support pin installation groove 160, the substrate support ring 820 may be installed so that a plurality of substrate support pins 810 are installed to pass through the filling member 700 and the substrate support plate 210 upward.

Since the support pin installation groove 160 is defined in the installation groove 130 to define a predetermined volume, the volume of the processing space S2 defined by the inner lid part 300 to be described later may increase.

To solve this limitation, the filling member 700 to be described laser may be installed in the installation groove 130 to cover the support pin installation groove 160, thereby blocking a space defined by the processing space S2 and the support pin installation groove 160. As a result, the processing space S2 may be defined in minimum volume.

More specifically, if there is no support pin installation groove 160, since a space for the substrate support pin 810 and the substrate support ring 820 to be described later is separately required under the substrate support plate 210, an increase of a dead volume may occur. Thus, to remove the dead volume, the support pin installation groove 160 may be defined so that the substrate support pin 810 and the substrate support ring 820 are inserted therein when descending.

Unlike this, the support pin installation groove 160 may not be installed in the bottom surface 120 of the process chamber 100, but may be defined in the filling member 700 installed in the installation groove 130.

That is, the support pin installation groove 160 may be defined to a predetermined depth in the top surface of the filling member 700, more specifically, to a depth at which the substrate support ring 820 and the substrate support pin 810 are inserted and thus may ascend to support the substrate 1 in a state of being inserted into the filling member 700.

Here, the substrate support pin 810 may be installed to pass through the filling member 700.

The gas supply port 170 may have a configuration which is provided at one side of the chamber body 110 of the process chamber 100 and to which the non-processing gas supply part 510 is connected.

For example, the gas supply port 170 may be defined through processing at one side of the chamber body 110 or may be provided by being installed in a through-hole defined in one side of the chamber body 110.

Thus, in the gas supply port 170, the non-processing space gas supply part 510 is installed to connect the non-processing space S1 to the non-processing space gas supply part 510, and thus, the filling gas may be supplied to the non-processing space S1.

The gas exhaust port 180 may have a configuration which is provided at the other side of the chamber body 110 of the process chamber 100 and to which the non-processing space gas exhaust part 520 is connected.

For example, the gas exhaust port 180 may be defined through processing at the other side of the chamber body 110 or may be provided by being installed in a through-hole defined in the other side of the chamber body 110.

Thus, in the gas exhaust port 180, the non-processing space gas exhaust part 520 may be installed to exhaust the non-processing space S1.

The gas introduction passage 190 may have a configuration that is provided to transfer the process gas introduced from the outside to the bottom surface of the process chamber 100, i.e., a position that is in contact with the inner lid part 300, and may have various configurations.

For example, the gas introduction passage 190 may be connected to an external process gas storage part through the bottom surface or the side surface of the chamber body 110 and may be disposed on an end at a position of the bottom surface, which corresponds to the inner lid part 300, in particular, a gas supply passage 320 to be described later.

Thus, the gas introduction passage 190 may be connected to the gas supply passage 320 when the inner lid part 300 descends to be in close contact with the bottom surface 120 to transfer the process gas to the supply passage 320.

In this case, the gas introduction passage 190 may be provided through a pipe installed in the bottom surface of the process chamber 100, and for another example, the gas introduction passage 190 may be provided through processing inside the chamber body 110.

In addition, the gas introduction passage 190 may be provided at at least one position of the positions adjacent to the edge of the substrate 1 corresponding to the gas supply passage 320 to be described later on the bottom surface of the process chamber 100.

The substrate support 200 may have a configuration that is installed in the process chamber 100 so that the substrate 1 is seated on a top surface thereof and may have various configurations.

That is, the substrate support 200 may support the substrate 1 to be processed by seating the substrate 1 on the top surface thereof and may be fixed during the substrate processing process.

In addition, the substrate support 200 may include a heater therein to provide a temperature atmosphere in the processing space S2 for the substrate processing.

For example, the substrate support 200 may include a substrate support plate 210 on which the substrate 1 is seated on a top surface thereof, a substrate support post 220 passing through the bottom of the installation groove 130 so as to be connected to the substrate support plate 210, and the internal heater 230 installed in the substrate support plate 210.

The substrate support plate 210 may have a configuration in which the substrate 1 is seated on the top surface thereof and may be provided as a plate having a planar circular shape corresponding to the shape of the substrate 1.

Here, the substrate support plate 210 may be provided with a heater therein to create a process temperature for the substrate processing in the processing space S2. Here, the process temperature may be about 400° C. to 700° C.

The substrate support post 220 may have a configuration that passes through the bottom surface of the process chamber 100 so as to be connected to the substrate support plate 210 and may have various configurations.

The substrate support post 220 may pass through the bottom surface of the process chamber 100 so as to be coupled to the substrate support plate 210, and various conductors for supplying power to the heater may be installed in the substrate support post 220.

Figure 5:
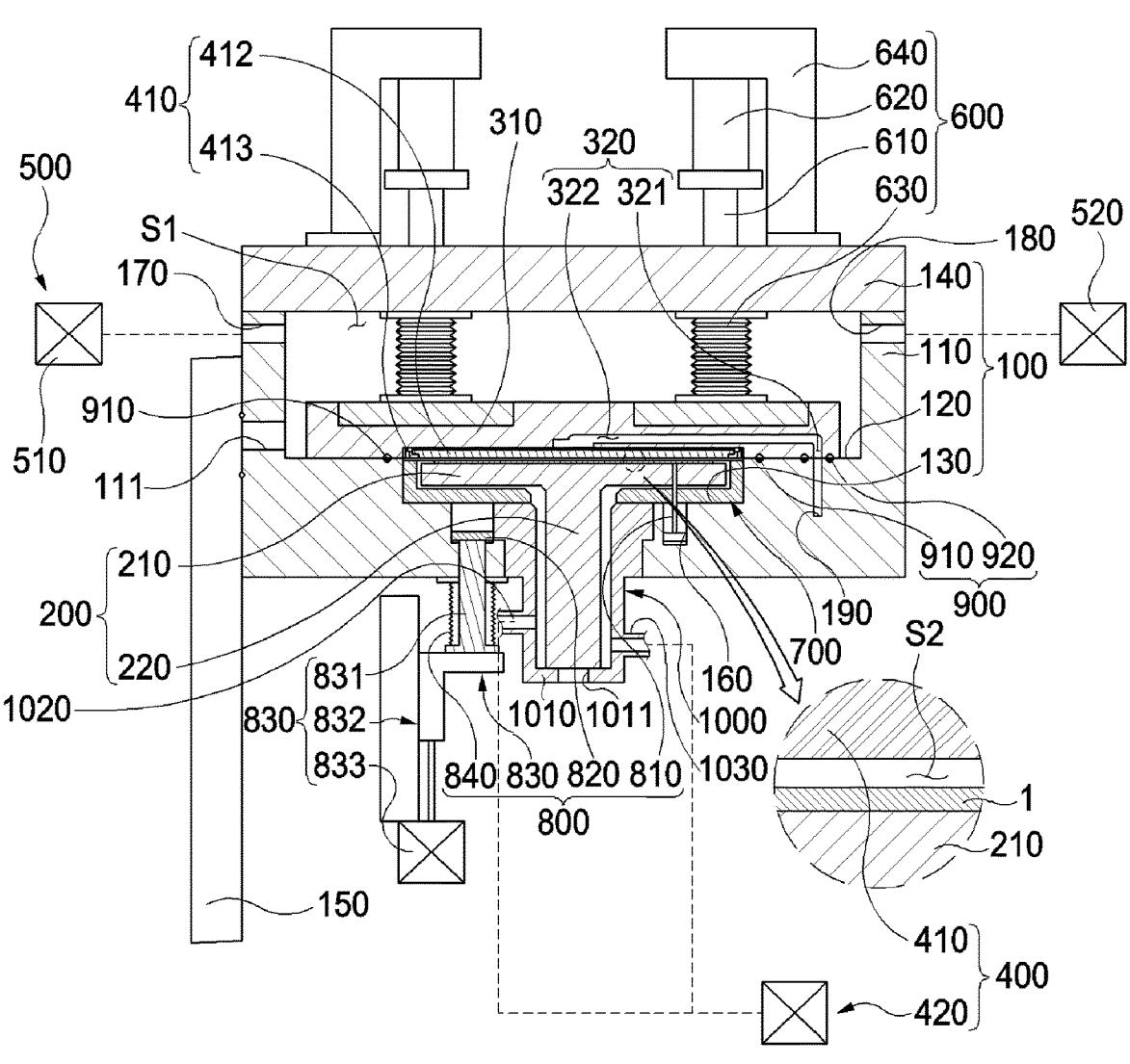
FIG. 5 is a cross-sectional view illustrating another example of the substrate processing apparatus according to the present invention.

As illustrated in FIG. 5, the substrate processing apparatus according to the present invention may be an apparatus for performing the substrate processing in which a high-pressure and low-pressure atmosphere is repeatedly changed and created within a short time, and more particularly, it is necessary to repeatedly change a pressure range of about 0.01 Torrs at a pressure change rate of about 1 Bar/s.

However, when considering a vast space volume of the inner space of the chamber body 110, the above-described pressure change rate may not be achieved, and thus, there is a need to minimize the volume of the processing space S2 for the substrate processing.

For this, the substrate processing apparatus according to the present invention includes an inner lid part 300 which is installed to be vertically movable in the inner space and of which a portion is in close contact with the process chamber 100 through descending to define the sealed processing space S2, in which the substrate support 200 is disposed.

The inner lid part 300 may have a configuration which is installed to be vertically movable in the inner space and of which a portion is in close contact with the process chamber 100 through the descending to define the sealed processing space S2, in which the substrate support 200 is disposed.

That is, the inner lid part 300 may be installed to be movable vertically in the inner space, and a portion of the inner lid part 300 may be in close contact with the bottom surface 120 adjacent to the installation groove 130 through the descending to divide the inner space into the processing space S2, in which the substrate support 200 is, and other non-processing space S1.

Thus, the inner lid part 300 may be installed to be vertically movable at an upper side of the substrate support 200 in the inner space so as to be in close contact with at least a portion of the inner surface of the process chamber 110 through the descending, and thus, the sealed processing space S2 may be defined between the inner lid part 300 and the inner bottom surface of the process chamber 100 as necessary.

Thus, the substrate support 200 may be disposed in the processing space S2 to perform the substrate processing on the substrate 1 seated on the substrate support 200 in the processing space S2 having the minimized volume.

For example, an edge of the inner lid part 300 may be in close contact with the bottom surface 120 through the descending to define the sealed processing space S2 between the bottom surface and the inner bottom surface of the process chamber 100.

For another example, the edge of the inner lid part 300 may be in close contact with the inner surface of the process chamber 100 through the descending to define the sealed processing space S2.

The edge of the inner lid part 300 may be in close contact with the bottom surface 120 through the descending to define the sealed processing space S2, and the substrate support 200 installed in the installation groove 130 may be disposed within the processing space S2.

Figure 2:
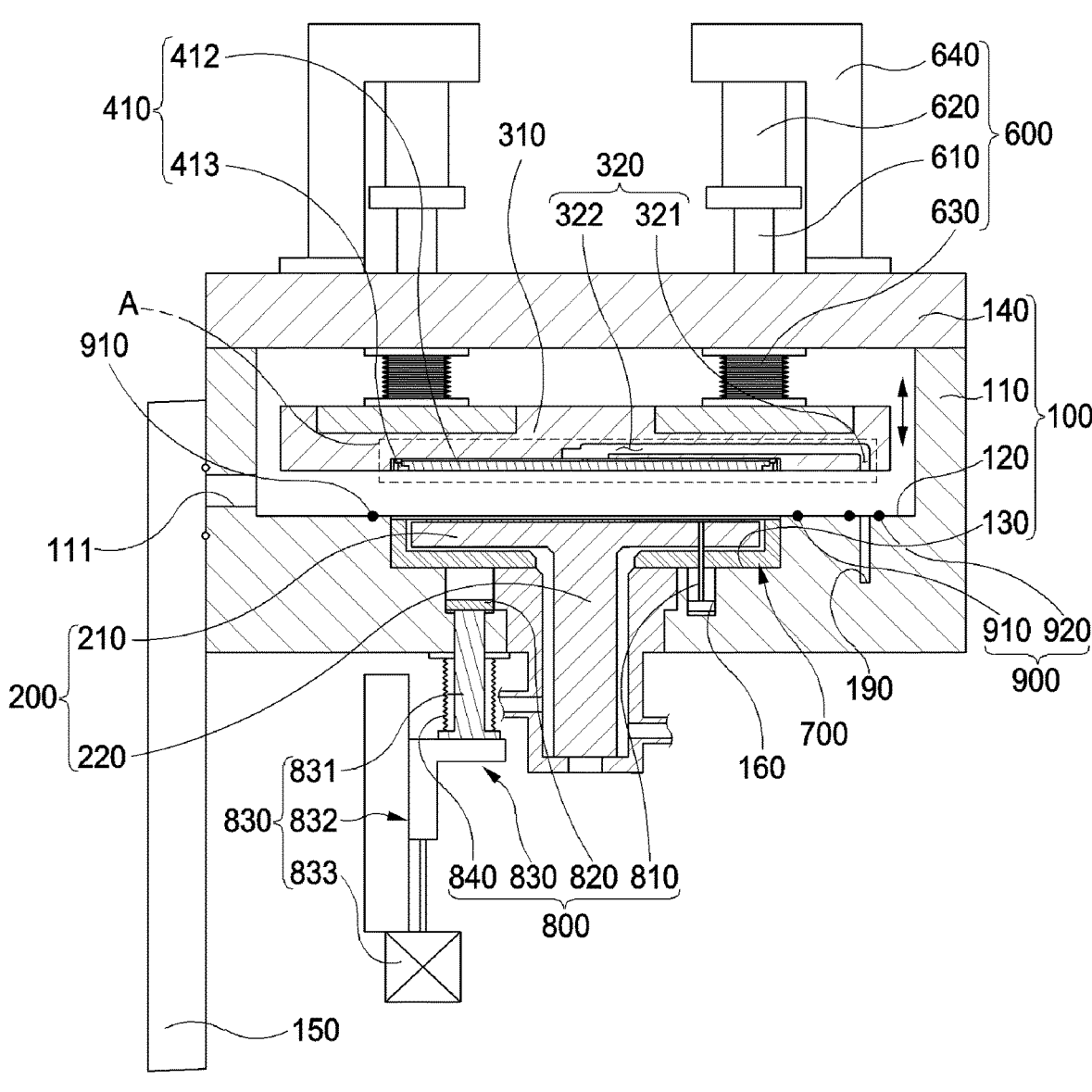
FIG. 2 is a cross-sectional view illustrating a state in which an inner lid part ascends in the substrate processing apparatus of FIG. 1.
Figure 3:
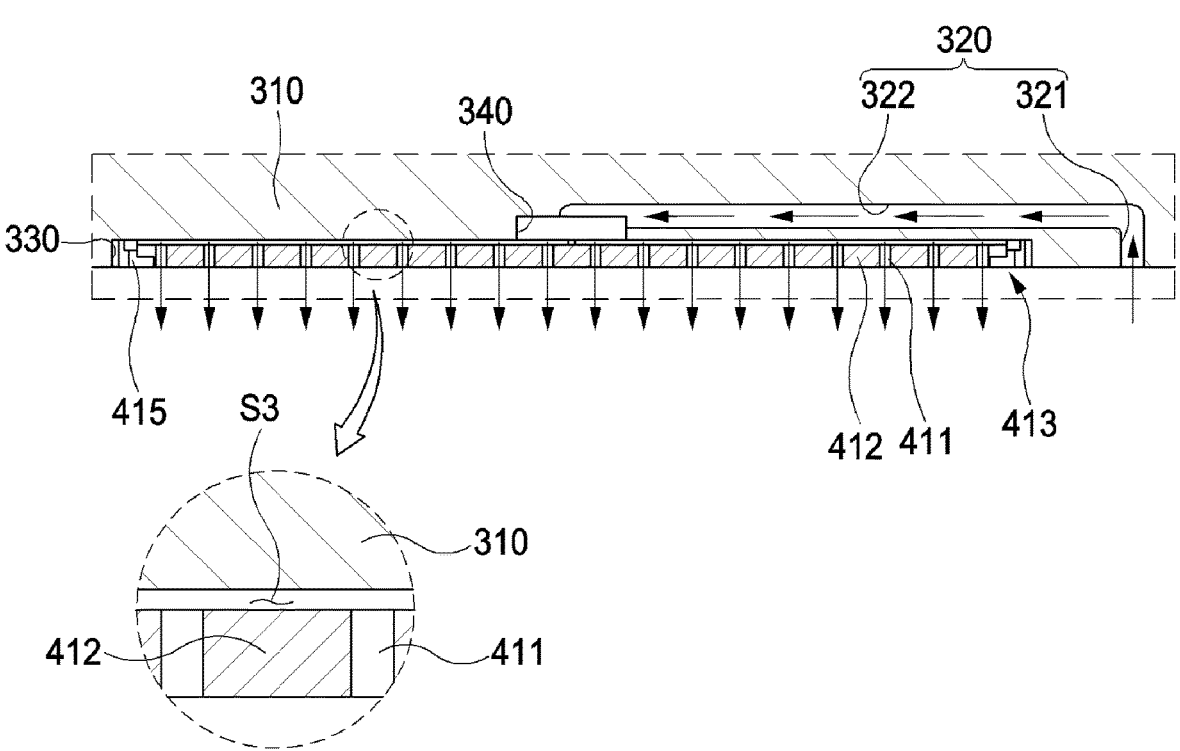
FIG. 3 is an enlarged cross-sectional view illustrating a portion A in the substrate processing apparatus of FIG. 2.

That is, as illustrated in FIG. 2, the edge of the inner lid part 300 may be in close contact with the bottom surface 120 disposed at a high position with a height difference with respect to the installation groove through the descending to define the sealed processing space S2 between the bottom surface and the installation groove 130.

Here, the substrate support 200, more specifically, the substrate support plate 210 and the filling member 700 may be installed in the installation groove 130 to minimize the volume of the processing space S2 and dispose the substrate 1 to be processed on the top surface thereof.

In this process, to minimize the volume of the processing space S2, the installation groove 130 may have a shape corresponding to the substrate support 200 installed in the processing space S2, more particularly, may be provided as a groove having a cylindrical shape corresponding to the circular substrate support plate 210.

That is, the installation groove 130 may have a shape corresponding to that of the substrate support plate 210 so that a remaining space except for the space, in which the substrate support plate 210 and the filling member 700 are installed, in the installation space, in which the installation groove 130 is defined, is minimized.

In this process, to prevent an interference between the substrate 1 seated on the top surface of the substrate support plate 210 and the inner lid part 300 from occurring, the bottom surface 120 may be disposed at a height higher than that of the top surface of the substrate 1 seated on the substrate support 200.

It means that, as a distance between the substrate 1 seated on the substrate support 200 and the bottom surface of the inner lid part 300 increases, the processing space S2 increases also in volume. Thus, the height of the bottom surface 120 may be set at a position at which the distance is minimized while preventing the interference between the substrate 1 and the inner lid part 300 from occurring.

The inner lid part 300 may have a configuration that moves vertically through the inner lid driving part 600 and may have various configurations.

The inner lid part 300 may have a configuration that is vertically movable in the inner space through the inner lid driving part 600.

Here, the inner lid part 300 may cover the installation groove 130 on a plane, and the edge of the inner lid part 300 may have a size corresponding to a portion of the bottom surface 120. In addition, the edge may be in close contact with the bottom surface 120 to define the sealed processing space S2 between the installation groove 130 and the inner lid part 300.

For another example, the edge of the inner lid part 300 may be in close contact with the inner surface of the process chamber 100 to define the processing space S2.

In addition, to effectively achieve and maintain the process temperature in the sealed processing space S2 defined according to the vertical movement, the inner lid part 300 may be made of a material having an excellent thermal insulation effect that is capable of preventing the temperature of the processing space S2 from being lost to the inner space.

In addition, the inner lid part 300 may be provided with a gas supply passage 320 therein to transfer the process gas received from the above-described gas introduction passage 190 to a gas supply part 410 to be described later.

For example, the inner lid part 300 may include an inner lid 310 that moves vertically in the inner space, and a gas supply passage 320 provided to communicate with the processing space S2 inside the inner lid 310.

In addition, the inner lid 310 may have an insertion groove 330 in which the gas supply part 410 to be described later is inserted and installed in the bottom surface.

In addition, the inner lid 310 may have a gas introduction groove 340 connected to an end of the gas supply passage 320 on the center side of the bottom surface.

The inner lid 310 may have a configuration that moves vertically in the inner space and may be provided in a size and shape to cover the installation groove 130 of the process chamber 100.

For example, the inner lid 310 may have a circular plate shape and may be provided in a planar shape corresponding to the substrate 1.

The gas supply passage 320 may have a configuration that is provided to communicate with the processing space S2 inside the inner lid 310, and may have various configurations.

Here, the gas supply passage 320 may be provided through a pipe installed inside the inner lid 310, like the gas introduction passage 190 described above, and for another example, the gas supply passage 320 may be provided by processing the inside of the inner lid 310.

The gas supply passage 320 may be in close contact with the bottom surface 120 through descending of the inner lid 310 so as to be connected to the gas introduction passage 190 and may receive the process gas through the gas introduction passage 190 to supply the process gas to the gas supply part 410 through the gas introduction groove 340 to be described later.

For this, the gas supply passage 320 may include a vertical supply passage that is provided at a position corresponding to the gas introduction passage 190 at the edge side of the inner lid 310 and is connected to the gas introduction passage 190, and a horizontal supply passage 322 provided from the vertical supply passage 321 toward the center of the inner lid 310.

That is, the vertical supply passage 321 may be provided in the vertical direction at a position corresponding to the gas introduction passage 190 on a plane at a side of the edge of the inner lid 310 to receive the process gas from the gas introduction passage 190, thereby transferring the process gas to the gas introduction groove 340 through the horizontal supply passage 322 that extends from the vertical supply passage 321 and is provided toward a center of the inner lid 310.

In this case, since the process gas is received from the gas introduction passage 190 through the vertical supply passage 321, to minimize the leakage of the process gas through the contact surface between the inner lid part 300 and the process chamber 100, the vertical supply passage 321 may have an inner diameter greater than or equal to that of the gas introduction passage 190.

The insertion installation groove 330 may have a configuration in which at least a portion of the gas supply part 410 to be described later is inserted and installed into the bottom surface of the inner lid 310.

For this, the insertion installation groove 330 may be provided in a shape corresponding to the gas supply part 410 on the bottom surface of the inner lid 310, and a gas introduction groove 340 may be additionally defined at the central side.

Here, in the insertion installation groove 330, a diffusion space S3 may be defined between the insertion installation groove 330 and the gas supply part 410 to be described later to increase in volume of the diffusion space S3, and also, the inner surface may have an inclination that gradually increases from the edge toward the central side may be defined.

That is, the insertion installation groove 330 may have an inclination that increases in radius toward the edge toward the lower side so that the inner surface has a triangular pyramid shape.

The gas introduction groove 340 may have a configuration that is connected to an end of the gas supply passage 320 at the central side of the bottom surface to inject the process gas toward the diffusion space S3.

Here, the gas introduction groove 340 may have an inner surface defined in the vertical direction to supply the process gas, and for another example, the inclination may be defined so that a diameter increases downward, and thus, the supplied process gas may be induced to be diffused and supplied in the horizontal direction, i.e., toward the edge.

Figure 6:
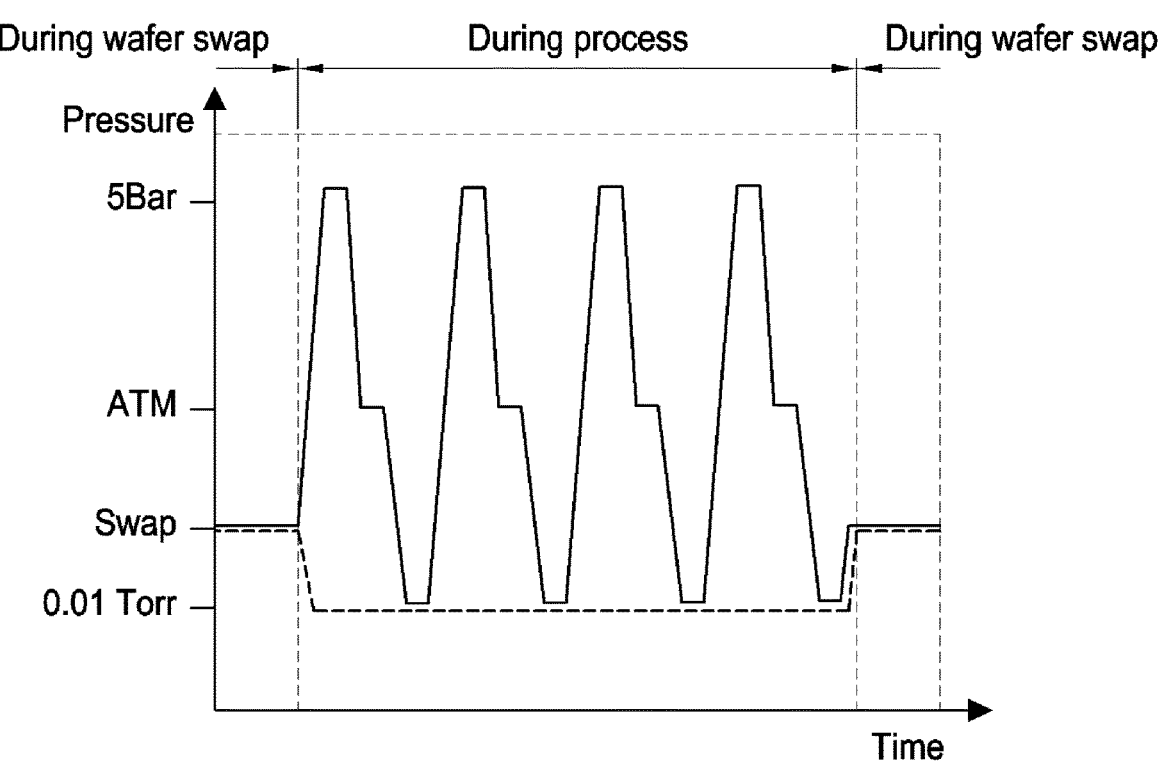
FIG. 6 is a graph illustrating a pressure change in each of a processing space and a non-processing space, which is performed through the substrate processing apparatus of FIG. 1.
Figure 7:
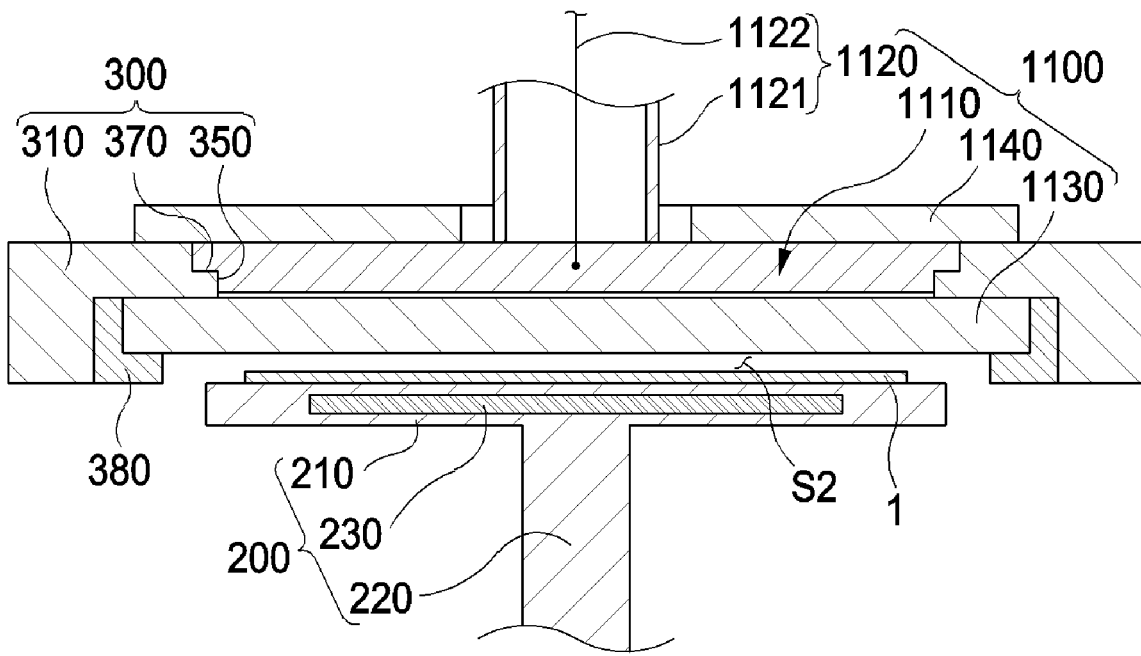
FIG. 7 is a cross-sectional view illustrating a temperature adjusting part of the substrate processing apparatus of FIG. 1.
Figure 8:
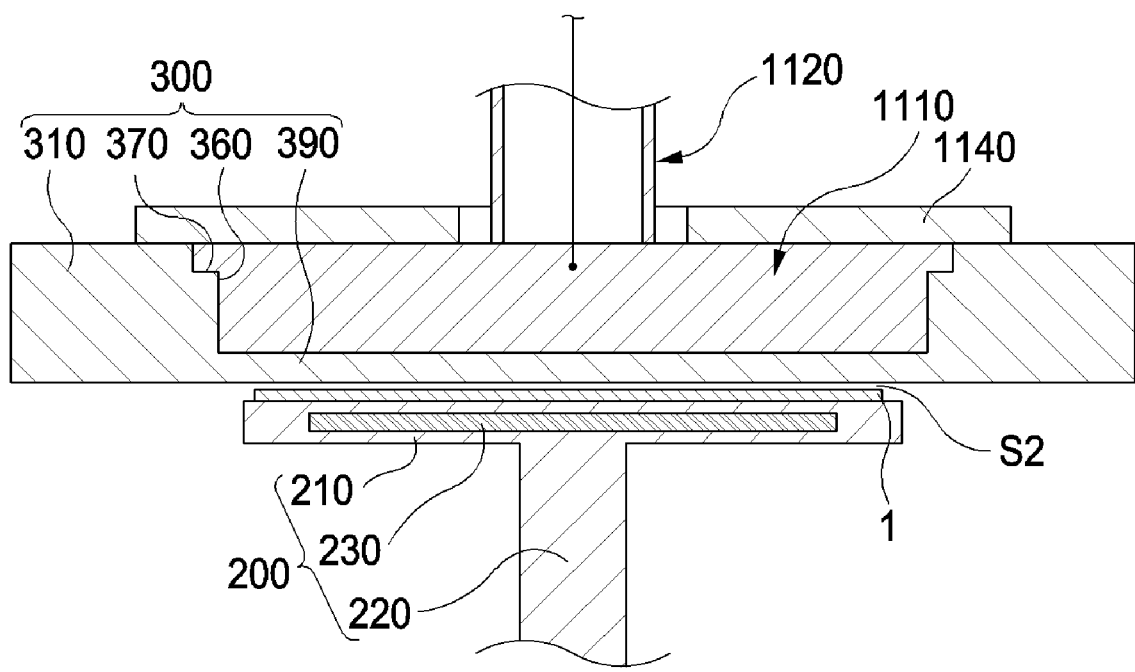
FIG. 8 is a cross-sectional view illustrating another example of the temperature adjusting part of the substrate processing apparatus of FIG. 1.

In addition, as illustrated in FIGS. 6 to 8, the inner lid part 300 may have a configuration in which a temperature adjusting part 1100 to be described later is installed.

Here, the inner lid part 300 may have a through-hole 350 defined in a central side so that a temperature adjusting part 1100 to be described later, more specifically, a temperature adjusting plate 1110 and a buffer plate 1130 are installed. In addition, the temperature adjusting plate 1110 may be installed in the rough-hole 350 from an upper side.

More specifically, the through-hole 350 may be defined at a position of the inner lid 310 opposite to the substrate 1 and the substrate support plate 210 so that the temperature adjusting plate 1110 is installed.

Here, to support the temperature adjusting plate 1110, a support stepped part 370 may be provided at an upper side of the through-hole 350 in a radial direction of the inner lid 310, and an end of the temperature adjusting plate 1110 may be supported on the support stepped part 370 so that the temperature adjusting plate 1110 is stably supported and installed in the through-hole 350.

For another example, as illustrated in FIG. 8, the inner lid part 300 may have an insertion groove 360 defined in a top surface thereof so that the temperature adjusting plate 1110 to be described later is inserted and installed therein.

That is, unlike the above-described structure, as illustrated in FIG. 8, the inner lid 310 may have the simple insertion groove 360 in the top surface thereof so that the temperature adjusting plate 1110 is inserted into the insertion groove 360. Here, the insertion groove 330 may be defined at the central side of the inner lid 310 that is a position opposite to the substrate 1 and the substrate support 200.

In this case as well, as described above, the support stepped part 370 may also be provided at the upper side of the insertion groove 360 in the radial direction of the inner lid 310 to support the temperature adjusting plate 1110 inserted and installed in the insertion groove 360.

Furthermore, at this time, in the inner lid 310, a lower portion 390 of the insertion groove 360 may be made of a transparent material so that heat supplied through the temperature adjusting plate 1110 or heat provided from the processing space S2 to the temperature adjusting plate 1110 is easily transferred.

That is, the inner lid 310 may pass through the lower portion 390 of the insertion groove 360 to perform the heat exchange with the substrate 1 and the processing space S2. Thus, when considering that the temperature adjusting plate 1110 uses a heat supply method using an LED heater or a halogen heater, the lower portion 390 may be partially made of the transparent material through which heat is easily transferred.

The processing space pressure adjusting part 400 may have a configuration that communicates with the processing space S2 to adjust the pressure in the processing space S2 and may have various configurations.

For example, the processing space pressure adjusting part 400 may include a gas supply part 410 configured to supply the process gas to the processing space S2 and a gas exhaust part 420 configured to exhaust the processing space S2.

The processing space pressure adjusting part 400 may supply the process gas to the processing space S2 and adequately exhaust the processing space S2 to adjust the pressure of the processing space S2. Thus, as illustrated in FIG. 6, high-pressure and low-pressure pressure atmospheres may be repeatedly changed and created within a short time in the processing space S2.

Here, more specifically, the pressure of the processing space S2 may be repeatedly changed at a pressure change rate of about 1 Bar/s in a pressure range of about 5 Bars to about 0.01 Torrs.

Particularly, in this case, the processing space pressure adjusting part 400 may fall the pressure of the processing space S2 from a first pressure to a normal pressure, and thus, the pressure of the processing space S2 may decrease step by step from the normal pressure to a second pressure.

In addition, the processing space pressure adjusting part 400 may sequentially and repeatedly change the pressure of the processing space S2 from the first pressure to the second pressure and then to the first pressure several times to perform the substrate processing.

The gas supply part 410 may have a configuration that communicates with the processing space S2 to supply the process gas, and may have various configurations.

The gas supply part 410 may have a configuration that is disposed under the inner lid part 300 to inject the process gas transferred through the gas supply passage 320 into the processing space S2, and may have various configurations.

For example, the gas supply part 410 may include an injection plate 412 disposed under the inner lid part 300 and provided with a plurality of injection holes 411 and an injection plate support 413 supporting an edge of the injection plate 412 and coupled to the bottom surface of the inner lid part 300.

The gas supply part 410 may further include a plurality of coupling members 414 passing through the injection plate support 413 so as to be coupled to the inner lid part 300.

The injection plate 412 may be disposed below the inner lid part 300 and may have a configuration in which the process gas is injected into the processing space S2 through the plurality of injection holes 411.

Here, the injection plate 412 may be disposed to be spaced downward from the inner lid part 300 by a preset distance to define a diffusion space S3 in which the process gas is diffused between the injection plate 412 and the inner lid part 300.

The injection plate 412 may be made of a metal or quartz material. Particularly, the injection plate 412 may prevent heat generated from the substrate support 200 from being directly transfer to the inner lid part 300, thereby preventing the inner lid part 300 from being bent or damaged.

For this, the injection plate 412 may be made of SUS or quartz material having excellent thermal insulation performance, and a surface treatment capable of enhancing the thermal insulation performance or reflecting heat may be performed on the bottom surface.

The injection holes 411 may pass through the injection plate 412 in the vertical direction and may be provided in a plurality over the entire area to enable uniform process gas injection.

The injection plate support 413 may have a configuration that supports and installs the injection plate 412 described above, and may have various configurations.

For example, the injection plate support 413 may be provided in an annular shape to surround an edge of the circular injection plate 412 and may support the edge of the injection plate 412 to induce the installation of the injection plate 412.

For this, the injection plate support 413 may protrude toward the center on the inner surface to provide a support stepped part 415, on which the edge of the bottom surface of the injection plate 412 is seated, thereby preventing the injection plate 412 and the inner lid part 300 from being in direct contact with each other, serving as a buffer due to thermal deformation of the injection plate 412, and preventing the inner lid part 300 from being directly heated.

Figure 4:
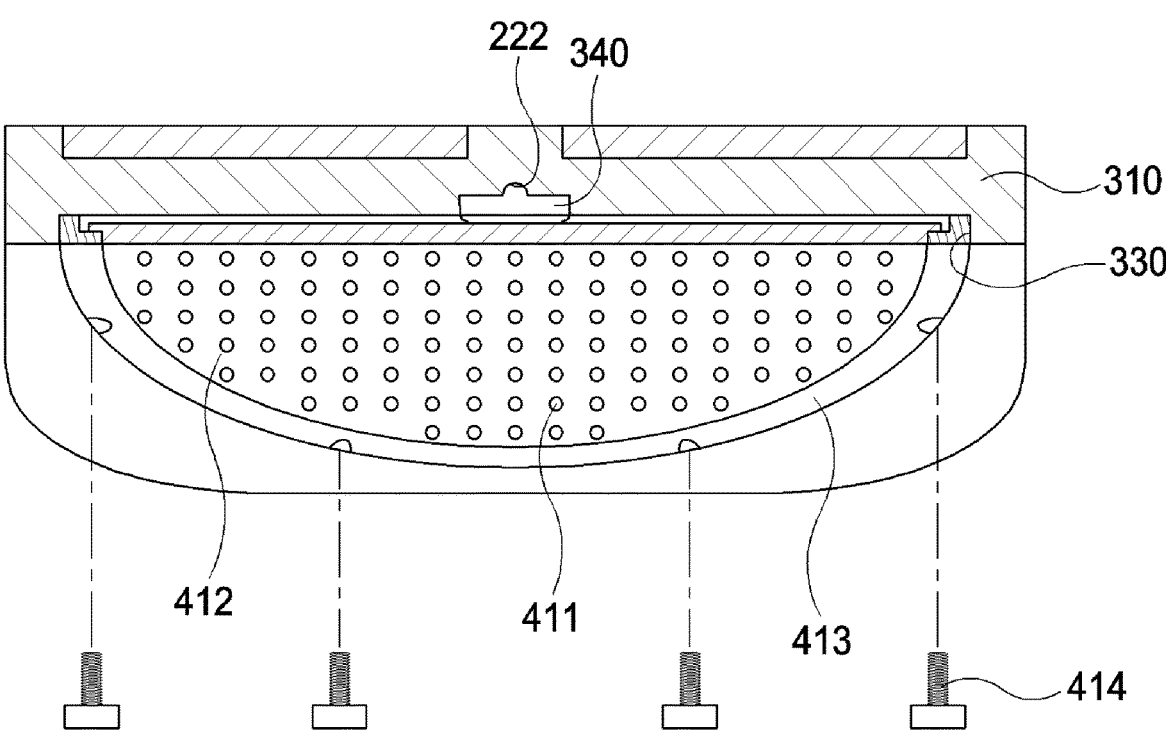
FIG. 4 is a bottom perspective view illustrating a portion of the gas injection part of the substrate processing apparatus of FIG. 1.

As illustrated in FIG. 4, the injection plate support 413 may be penetrated through a plurality of coupling members 414, and the coupling member 414 may be coupled to the bottom surface of the inner lid part 310 so as to be fixed and installed, and thus, the injection plate 412 may be supported.

In this case, the gas supply part 410 may be installed to be inserted into the insertion installation groove 330, and the bottom surface, i.e., bottom surfaces of the injection plate 412 and the injection plate support 413 may provide a plane with the bottom surface of the inner lid 310.

The gas supply part 410 may further include a diffusion member (not shown) that is inserted into the gas introduction groove 340 to diffuse the supplied process gas in the horizontal direction.

Here, the diffusion member has a cone or truncated cone shape in a forward direction in which an inclined surface is provided on a side surface so that a height increases toward the center, and the process gas supplied through the gas introduction groove 340 may be induced to be diffused toward the edge in the horizontal direction.

For this, the diffusion member may be installed while being supported on the bottom surface of the inner lid 310, and for another example, the diffusion member may be installed by being seated on the top surface of the injection plate 412.

The gas exhaust part 420 may have a configuration that exhausts the processing space S2, and may have various configurations.

For example, the gas exhaust part 420 may include an external exhaust device communicating with the processing space S2 and installed outside, and thus, an exhaust amount to processing space S2 may be controlled to adjust the pressure of the processing space S2.

The non-processing space pressure adjusting part 500 may have a configuration that communicates with the non-processing space S1 to adjust the pressure in the non-processing space S1 and may have various configurations.

Particularly, the non-processing space pressure adjusting part 500 may adjust the pressure in the non-processing space S1 defined separately from the processing space S2 independently of the processing space S2.

For example, the non-processing space pressure adjusting part 500 may include a non-processing space gas supply part 510 communicating with the non-processing space S1 to supply a filling gas to the non-processing space S1 and a non-processing space gas exhaust part 520 performing exhaust for the non-processing space S1.

The non-processing space gas supply part 510 may be connected to the above-described gas supply port 170 to supply the filling gas to the non-processing space S1, and thus, the pressure to the non-processing space S1 may be adjusted.

The non-processing space gas exhaust part 520 may be connected to the above-described gas exhaust port 180 to exhaust the non-processing space S1, and thus, the pressure of the non-processing space S1 may be adjusted.

Any configuration may be applied to the non-processing space gas supply part 510 and the non-processing space gas exhaust part 520 as long as the non-processing space gas supply part 510 and the non-processing space gas exhaust part 520 are configured to supply and exhaust the filling gas that is disclosed in the related art.

The configuration of the non-processing space pressure adjusting part 500 and the processing space pressure adjusting part 400 for controlling the pressure of the non-processing space S1 may be connected by sharing the same external exhaust device 1100, and for another example, each of the non-processing space pressure adjusting part 500 and the processing space pressure adjusting part 400 may be connected to a separate and independent external exhaust device to perform the exhaust.

In addition, the configuration of the non-processing space pressure adjusting part 500 and the processing space pressure adjusting part 400 may be connected by sharing the same external exhaust device, and for another example, each of the non-processing space pressure adjusting part 500 and the processing space pressure adjusting part 400 may be connected to a separate and independent external vacuum pump to perform the pumping.

In the process of changing the pressure of the processing space S2, in which the substrate 1 is seated, from the first pressure higher than the normal pressure to the second pressure, the non-processing space pressure adjusting part 500 may be configured to constantly maintain the pressure in the non-processing space S1.

Here, the non-processing space pressure adjusting part 500 may maintain the pressure of the non-processing space S1 as vacuum while the substrate processing is performed, and in this process, the pressure of the processing space S2 may be less than or equal to that of the processing space S2.

That is, the non-processing space pressure adjusting part 500 may constantly maintains the pressure of the non-processing space S1 at a pressure of about 0.01 Torrs, which is the second pressure, in the substrate processing process, to maintain the pressure so as to be equal to or less than that of the processing space S2. As a result, impurities may be prevented from being introduced from the non-processing space S1 into the processing space S2.

For another example, the non-processing space pressure adjusting part 500 may change the pressure of the non-processing space S1, and in this process, the pressure of the non-processing space S1 may have a pressure value less than that of the processing space S2.

In addition, the non-processing space pressure adjusting part 500 may adjust the pressure of the non-processing space S1 through only the exhaust without supplying the filling gas to the non-processing space S1 during the substrate processing process.

That is, the non-processing space pressure adjusting part 500 may adjust the pressure of the non-processing space S1 through only an operation of the non-processing space gas exhaust part 520 without suppling the filling gas according to the non-processing space gas supply part 510.

For another example, the non-processing space pressure adjusting part 500 may supply the filling gas to the non-processing space S1, and the pressure of the non-processing space S1 may be adjusted together with the exhaust of the non-processing space gas exhaust part 520.

Unlike the above, the non-processing space pressure adjusting part 500 may include a gas supply port 170 transferring the filling gas supplied from the outside and a gas exhaust port 180 exhausting the non-processing space S1 as a gas exhaust port 180 defined in one side of the process chamber 100. i.e., the chamber body 110, and a gas supply port 170 defined in the other side.

The controller may have a configuration that controls the pressure adjustment of the processing space S2 and the non-processing space S1 through the processing space pressure adjusting part 400 and the non-processing space pressure adjusting part 500.

Particularly, in connection with the process of the substrate processing, the controller may perform the control through the processing space pressure adjusting part 400 and the non-processing space pressure adjusting part 500 of the non-processing space S1 and the processing space S2 in each process.

For example, the controller may supply a purge gas through the gas supply part 410 to supply the purge gas through the gas supply part 400 and exhaust the purge gas through the non-processing space gas exhaust part 520 in a state in which the inner lid part 300 ascends to allow the processing space S2 and the non-processing space S1 communicate with each other.

More specifically, to perform cleaning of the processing space S2 in which the substrate processing is performed, the controller may supply the purge gas through the gas supply part 410 to clean or purge a surrounding of the substrate support 200, in which the substrate processing is performed, in a state in which the inner lid part 300 ascends so that the processing spaced S2 and the non-processing space S1 communicate with each other.

Furthermore, the purge gas may be exhausted through the non-processing space gas exhaust part 520 provided on the side surface of the process chamber 100 to induce an upward flow of the purge gas supplied through the gas supply part 410 to the side surface, thereby inducing internal floating matters to be exhausted to the non-processing space S1 and the outside.

In addition, before ascending of the inner lid part 300, the controller may control the pressure so that the pressures of the processing space S2 and the non-processing space S1 are the same through at least one of the processing space pressure adjusting part 400 or the non-processing space pressure adjusting part 500.

More specifically, the controller may control the pressure so that the pressures of the processing space S2 and the non-processing space S1 are the same through at least one of the processing space pressure adjusting part 400 or the non-processing space pressure adjusting part 500 to prevent the substrate 1 from being changed in position or damaged due to a pressure difference between the non-processing space S1 and the processing space S2 before the substrate processing is performed in a state in which the inner lid part 300 descends to define the sealed processing space S2, and the inner lid part 300 ascends to unload the processed substrate 1.

That is, when the non-processing space S1 and the processing space S2 communicate with each other due to the ascending of the inner lid part 300 while the pressure difference between the non-processing space S1 and the processing space S2 is maintained, in order to prevent the substrate 1 from being affected by the generation of the airflow in one direction due to the pressure difference, the controller may control at least one of the processing space pressure adjusting part 400 and the non-processing space pressure adjusting part 500 so that the pressures of the non-processing space S1 and the processing space S2 are the same.

The substrate processing apparatus according to the present invention may further include a sealing part 900 including a first sealing member 910 provided on a contact surface between the inner lid part 300 and the process chamber 100 to prevent the process gas from leaking from the processing space S2 to the non-processing space S1 and a second sealing part configured to prevent the processing gas from leaking through the gas supply passage 190.

The sealing part 900 may have a configuration provided on at least one of the inner lid part 300 or the bottom surface 120 of the process chamber 100 and may be provided to correspond to a position at which the bottom surface 120 of the processing chamber 100 and the inner lid part 300 are in close contact with each other.

When the edge of the inner lid part 300 is in close contact with the bottom surface 120 to define the sealed processing space S2, the first sealing part 910 may be provided along an edge of the bottom surface of the inner lid part 300 so as to be in contact with the bottom surface 120.

Thus, the first sealing part 910 may induce the formation of the sealed processing space S2 and prevent a process gas of the processing space S2 from leaking to the outside of the inner space.

In addition, the second sealing member 920 may be installed to surround the gas introduction passage 190 or surround the gas supply passage 320 on the bottom surface of the inner lid 310 to prevent the process gas from leaking through the contact surface when the inner lid 310 descends to connect the gas introduction passage 190 to the gas supply passage 320.

Here, each of a first sealing member 910 and a second sealing member 920 may be an O-ring having a shape that is disclosed in the related art.

In addition, the sealing part 900 may be installed by being inserted into a groove provided in the bottom surface 120 and may be in close contact with or separated from the inner lid part 300 according to the vertical movement of the inner lid part 300.

For another example, the sealing part 900 may also be provided on the bottom surface of the inner lid part 300.

The inner lid driving part 600 may be installed to pass through the top surface of the process chamber 100 so as to drive the vertical movement of the inner lid part 300 and may have various configurations.

For example, the inner lid driving part 600 may include a plurality of driving rods 610, each of which one end passes through the top surface of the process chamber 100 and is coupled to the inner lid part 300, and at least one driving source 620 connected to the other end of each of the plurality of driving rods 610 to drive the driving rods 610 vertically.

In addition, the inner lid driving part 600 may further include a fixing support 630 installed on the top surface of the process chamber 100, i.e., the top lid 140 to fix and support the end of the driving rod 610 and a first bellows 630 installed to surround the driving rod 610 between the top surface of the process chamber 100 and the inner lid part 300.

In addition, since the rod part 1120 of the temperature adjusting part 1100 to be described later moves vertically according to the vertical movement of the inner lid part 300, the rod part 1120 may be installed to pass through the top lid 140 to cause the gas leakage. As a result, the inner lid driving part 600 may include a second bellows 650 installed to surround the rod part 1120 to prevent the gas from leaking to the outside.

The driving rod 610 may have a configuration having one end passing through the top surface of the process chamber 100 so as to be coupled to the inner lid part 300 and the other end coupled to the driving source 620 outside the process chamber 100 to drive the inner lid part 300 vertically through the vertical movement due to the driving source 620.

Here, the driving rod 610 may be provided in plurality, more particularly, two or four to be coupled to the top surface of the inner lid part 300 at a predetermined interval so that the inner lid part 300 moves vertically while being maintained horizontally.

The driving source 620 may have a configuration that vertically drives the driving rod 610 installed and coupled to the fixing support 640 and may have various configurations.

The driving source 620 may be applied to any configuration as long as it is driving method that is disclosed in the related art, for example, various driving methods such as a cylinder method, an electromagnetic driving, screw motor driving, cam driving, and the like may be applied.

The first bellows 630 may have a configuration that is installed to surround the driving rod 610 between the top surface of the process chamber 100 and the inner lid part 300 to prevent the gas in the inner space from leaking thought the top surface of the process chamber 100.

Here, the first bellows 630 may be installed in consideration of the vertical movement of the inner lid part 300.

The second bellows 650 may be installed so that one end thereof is coupled to a cover plate 1140 to be described later, and the other end thereof is coupled to the bottom surface of the top lid 140 to surrounds the rod part 1120, thereby preventing the gas from leaking through the top lid 140 passing through the rod part 1120 even in the vertical movement of the inner lid part 300 and the temperature adjusting plate 1110.

The temperature adjusting part 1100 may have a configuration that is installed in the inner lid part 300 to adjust the temperature of the substrate 1 disposed in the processing space S2 together with the internal heater 230, and may have various configurations.

That is, the temperature adjusting part 1100 may have a configuration that heats or cools the substrate 1 so as to adjust the temperature of the processing space S2 and the substrate 1 together with the internal heater 230.

For example, as illustrated in FIG. 7, the temperature adjusting part 1100 may include the temperature adjusting plate 1110 installed in the inner lid part 300 to heat or cool the substrate 1 and the rod part 1120 passing through the top lid 140 so as to be coupled to the temperature adjusting plate 1110.

In addition, the temperature adjusting part 1100 may further include a buffer plate 1130 coupled to the through-hole 350 at the lower side of the inner lid part 300 to cover the temperature adjusting plate 1110.

In addition, the temperature adjusting part 1100 may further include a cover plate 1140 installed to cover the through-hole 350 at the upper side of the inner lid part 300.

The temperature adjusting plate 1110 may have a configuration that is installed on the inner lid part 300 to heat or cool the substrate 1, and may have various configurations.

For example, the temperature adjusting plate 1110 may be installed in the through-hole 350 defined in the inner lid 310 as described above to heat or cool the substrate 1.

The above-described internal heater 230 may be configured to supply heat to the substrate 1 and the processing space S2 through the substrate support plate 210 due to heating of a heating element through power supply, and an initial heating time may take a long time, and there is a limitation in that it is difficult to immediately respond to a rapid temperature change.

Thus, the temperature adjusting plate 1110 may have a configuration for immediately supplying heat to the substrate 1 within a short time, and for example, a halogen or LED heater may be applied.

In addition, the temperature adjusting plate 1110 may have a cooling passage defined therein to immediately cool the substrate 1 within a short time, thereby cooling the substrate 1 through circulation of a refrigerant.

The temperature adjusting plate 1110 may have a height difference on the edge thereof. As described above, the temperature adjusting plate 1110 may be supported and installed on the support stepped part 370 disposed in the through-hole 350 of the inner lid 310.

Furthermore, for another example, the temperature adjusting plate 1110 may be installed on the bottom surface of the inner lid 310 to be directly exposed to the substrate 1 through simple attachment, coupling, or the like.

In addition, the temperature adjusting plate 1110 may include at least two temperature adjusting areas that are separated from each other on a plane and are independently adjustable in temperature.

Figure 9:
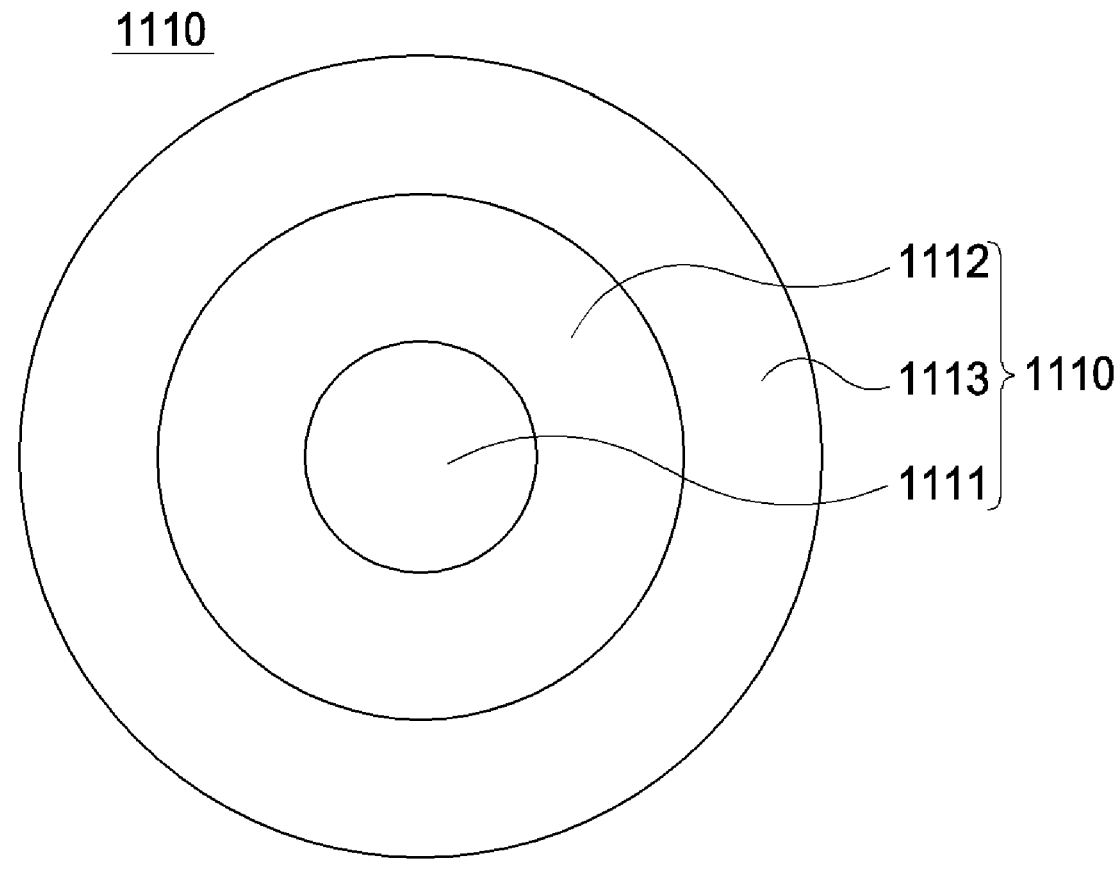
FIG. 9 is a cross-sectional view illustrating divided temperature adjusting areas of the temperature adjusting part in the substrate processing apparatus of FIG. 1.

Here, as illustrated in FIG. 9, the temperature adjusting areas may include a first temperature adjusting area 1111 that shares a center with the planar circular temperature adjusting plate 1110 and is divided into a planar circular shape at a position corresponding to the central side of the substrate 1; a third temperature adjusting area 1113 separated from an edge of the temperature adjusting plate 1110; and a second temperature adjusting area 1112 divided between the first temperature adjusting area 1111 and the third temperature adjusting area 1113 area.

That is, the temperature adjusting areas may be divided into areas that are capable of being independently adjustable in temperature according to areas corresponding to the substrate 1, which are opposite to the temperature adjusting plate 1110, and thus, the temperature may be independently adjusted on specific areas.

The rod part 1120 may have a configuration coupled to the temperature adjusting plate 1110 through the top lid 140 and may have various configurations.

Here, the rod part 1120 may have a configuration that supplies various refrigerants or power to the temperature adjusting plate 1110 from the outside by having a hollow defined therein.

For example, the rod part 1120 may include a rod 1121 passing through the top lid 140 and be coupled to the temperature adjusting plate 1110 to support the temperature adjusting plate 1110 and a supply line 1122 inserted into a hollow of the rod 1121 to supply the power or refrigerant to the temperature adjusting plate 1110 from the outside.

The buffer plate 1130 may have a configuration that is coupled to the through-hole 350 at the lower side of the inner lid part 300 to cover the temperature adjusting plate 1110, and may various configurations.

For example, as illustrated in FIG. 6, the buffer plate 1130 may be coupled to the through-hole 350 at the lower side of the inner lid part 300 and be disposed between the temperature adjusting plate 1110 and the substrate 1 to mediate the heat exchange between the temperature adjusting plate 1110 and the substrate 1.

Here, the buffer plate 1130 may be manufactured with a stable design even in high temperature and high pressure environments and may be made of a quartz material.

Thus, the buffer plate 1130 may minimize an influence of the high pressure by preventing the direct exposure of the temperature adjusting plate 1110 to the high pressure environment of the processing space S2 to facilitate the heat exchange while protecting the temperature adjusting plate 1110.

Here, as illustrated in FIG. 2, the buffer plate 1130 may be installed below the through-hole 350 of the inner lid 310, and more specifically, may be supported and installed on the support 380 installed on a lower edge of the through-hole 350 of the inner lid 310.

The cover plate 1140 may have a configuration installed to cover the through-hole 350 at the upper side of the inner lid part 300 and may have various configurations.

For example, the cover plate 1140 may cover the through-hole 350 in which the temperature adjusting plate 1110 of the inner lid 310 is installed in a state in which the rod part 1120 passes therethrough, and an end of the above-described second bellows 650 may be coupled to facilitate the movement of the temperature adjusting plate 1110.

The temperature controller may have a configuration that controls the heating or cooling of the temperature adjusting part 1100.

For example, in consideration of the fact that the temperature of the edge of the substrate 1 is relatively low compared to the central side, for this, the temperature controller may control the third temperature adjusting area 1113 so that the third temperature adjusting area 1113 has a temperature higher than that of the first temperature adjusting area 1111.

In addition, the temperature controller may control the temperature adjusting part 1100 so that the temperature of the substrate 1 or the processing space S2 is constantly maintained while a pressure of the processing space S2 is changed.

Particularly, as illustrated in FIG. 6, in the substrate processing apparatus according to the present invention, a rapid pressure change may occur in the processing space S2, and thus, the temperature change may rapidly occur due to the pressure change in the processing space S2 in which the substrate 1 is disposed may be performed.

To prevent such a temperature change, the temperature adjusting part 1100 may be controlled so that the temperatures of the substrate 1 and the processing space S2 are constantly maintained.

As described above, when the substrate support 200 is installed in the installation groove 130, a space may be defined between the substrate support 200, more particularly, the substrate support plate 210 and the installation groove 130 to act as a factor that increases in volume of the processing space S2.

To solve this limitation, when the substrate support 200 is installed to be in contact with the installation groove 130, heat supplied through the heater existing in the substrate support 200 may be lost to the process chamber 100 through the bottom surface of the process chamber 100, i.e., the installation groove 130 to cause a heat loss. As a result, it may be difficult to set and maintain the process temperature with respect to the processing space S2, and efficiency may be deteriorated.

To solve this limitation, the filling member 700 according to the present invention may have a configuration that is installed between the substrate support 200 and the bottom surface of the process chamber 100, and may have various configurations.

For example, the filling member 700 may be installed in the installation groove 130, and in the state of being installed in the insulation groove 130, the substrate support plate 210 may be installed at the upper side to minimize a remaining volume between the installation groove 130 and the substrate support plate 210, thereby reducing the volume of the processing space S2.

For this, the filling member 700 may be provided in a shape corresponding to the interspace between the installation groove 130 and the substrate support 200 so that the processing space S2 is minimized.

More specifically, the filling member 700 may have a planar circular shape and may be provided in shape corresponding to the interspace between the installation groove 130, which is defined to have a predetermined depth from the bottom surface 120 with the height difference, and the substrate support plate 210.

For this, the filling member 700 may have a shape of the circular plate provided between the substrate support plate 210 and the installation groove 130 or may have an edge that is provided with an upwardly stepped portion to occupy the interspace between the side surface of the substrate support plate 210 and the installation groove 130 in the shape of the circular plate.

That is, the filling member 700 may be installed to be adjacent to at least one of the side surface or the bottom surface of the substrate support plate 210 and may be spaced apart from the substrate support plate 210 to surround the bottom surface and the side surface of the substrate support plate 210.

Here, to prevent the heat from being lost through the filling member 700, the substrate support 200 may be installed to be spaced apart from the filling member 700, and in more detail, the substrate support 200 may be installed with a degree of a fine gap by which the substrate support 200 is not contact with the filling member 700.

As a result, a predetermined distance may be maintained between the substrate support 200 and the filling member 700, and the gap may act as an exhaust passage, and thus, exhaust with respect to the processing space S2 may be performed.

More specifically, the substrate support 200 and the filling member 700 may be installed to be spaced apart from each other to define the exhaust passage. Here, the exhaust passage may communicate with the bottom of the installation groove 130, through which the substrate support post 220 passes, to exhaust the process gas within the processing space S2 to the outside.

The filling member 700 may be made of at least one of quartz, ceramic, or SUS.

In addition, the filling member 700 may not only simply occupy the space between the installation groove 130 and the substrate support 200 to minimize the volume of the processing space S2, but also minimize the loss of the heat transferred to the substrate 1 through the substrate support 200 through thermal insulation and furthermore reflect the heat that is lost to the processing space S2 through thermal reflection.

That is, the filling member 700 may not only minimize the volume of the processing space S2, but also insulate for preventing the heat from being lost through the substrate support 200 to the bottom surface 120 of the process chamber 100, furthermore, perform a reflection function to be improved in thermal efficiency through the reflection of heat.

In addition, to improve the reflection effect of the heat emitted through the substrate support 200 to the processing space S2, a reflection part provided on the surface of the substrate support 200 may be additionally provided.

That is, the filling member 700 may include an insulating part for blocking heat from the processing space S2 to the outside and a reflection part provided on a surface of the insulating part to reflect heat.

Here, the reflection part may be coated, adhered, or applied on the surface of the heat insulating part to provide a reflection layer and may reflect heat lost from the processing space S2 through the process chamber 100 so as to be transferred again to the processing space S2.

In addition, the filling member 700 may further include a first through-hole having a size corresponding to a center so that the foregoing substrate support post 220 is installed and a plurality of second through-holes passing through the plurality of substrate support pins 810 to move vertically.

The substrate support pin part 800 may have a configuration that supports the substrate 1 loaded into or unloaded from the process chamber 100 and is seated on the substrate support 200 and may have various configurations.

For example, the substrate support pin part 800 may include a plurality of substrate support pins 810 passing through the filling member 700 and the substrate support 200 to move vertically, thereby supporting the substrate 1, an annular substrate support ring 820 on which the plurality of substrate support pines 810 are installed, and a substrate support pin driving part 830 that drive the plurality of substrate support pins 810 vertically.

The plurality of substrate support pins 810 may have a configuration that is provided in plurality on the substrate support ring 820 to pass through the filling member 700 and the substrate support 200 so as to move vertically, thereby supporting the substrate 1 and may have various configurations.

Here, the plurality of substrate support pins 810 may be provided in at least three and may be installed to be spaced apart from each other on the substrate support ring 820. Also, the plurality of substrate support pins 810 may ascend to be exposed from the substrate support 200, thereby supporting the substrate 1 that is loaded or may descend to be disposed inside the substrate support 200, thereby seating the substrate 1 on the substrate support 200.

The substrate support ring 820 may have an annular configuration on which the plurality of substrate support pins 810 are installed so that the plurality of substrate support pins 810 move vertically at the same time through the vertical movement.

Particularly, the substrate support ring 820 may be installed in a support pin installation groove 160 defined in the bottom surface of the process chamber 100, that is, the installation groove 130 to move vertically by a substrate support pin driving part 830.

The substrate support pin driving part 830 may have a configuration that is installed outside the process chamber 100 to drive the substrate support ring 820 vertically, and may have various configurations.

For example, the substrate support pin driving part 830 may include a substrate support pin rod 831 that has one end connected to the bottom surface of the substrate support ring 820 and the other end connected to a substrate support pin driving source 833 to move vertically according to driving force of the substrate support pin driving source 833, and a substrate support guide 832 configured to guide linear movement of the substrate support pin rod 831, and a substrate support pin driving source 833 configured to drive the substrate support pin rod 831.

In addition, the substrate support pin part 800 may further include a substrate support bellows 840 that surrounds the substrate support pin rod 831 and is installed between the bottom surface of the process chamber 100 and the substrate support pin driving source 833.

The manifold part 1000 may have a configuration that is installed on the bottom surface of the process chamber 100 so as to communicate with the processing space S2 so that at least one processing space exhaust port is provided to allow the gas exhaust part 420 to communicate with each other and may have various configurations.

For example, as illustrated in FIG. 5, the manifold part 1000 may include a manifold 1010 installed on the bottom surface of the process chamber 100 to communicate with the processing space S2 and a processing space exhaust port provided on the manifold 1010 and coupled to at least one of the above-described processing gas pressure adjusting part 400.

In this case, the manifold 1010 may be installed on the bottom surface of the process chamber 100 to communicate with the processing space S2 to perform the exhaust.

In addition, the manifold 1010 may have a lower through-hole 1011 so that various conductors connected to a heater installed in the substrate support plate through the above-described substrate support shaft 220 are installed to pass therethrough.

The processing space exhaust port may include a high-pressure exhaust port 1020 constituting the gas exhaust part 420 and connected to the high-pressure controller 420 as described above and a pumping exhaust port 1030. For another example, the processing space exhaust port may be provided as a single port on the manifold 1010 to communicate with all the high-pressure exhaust port 1020 and the pumping exhaust port 1030 in a state of being coupled to the high-pressure exhaust port 1020 and the pumping exhaust port 1030.

Hereinafter, a substrate processing method using the substrate processing apparatus according to the present invention will be described with reference to the accompanying drawings.

Figure 10:
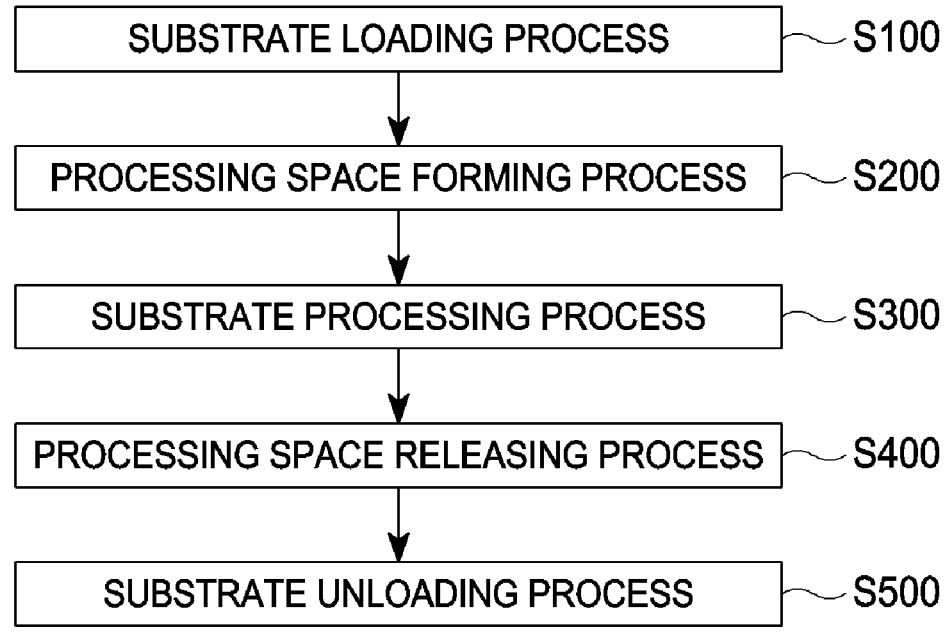
FIG. 10 is a flowchart illustrating a substrate processing method using the substrate processing apparatus of FIG. 1.
Figure 11:
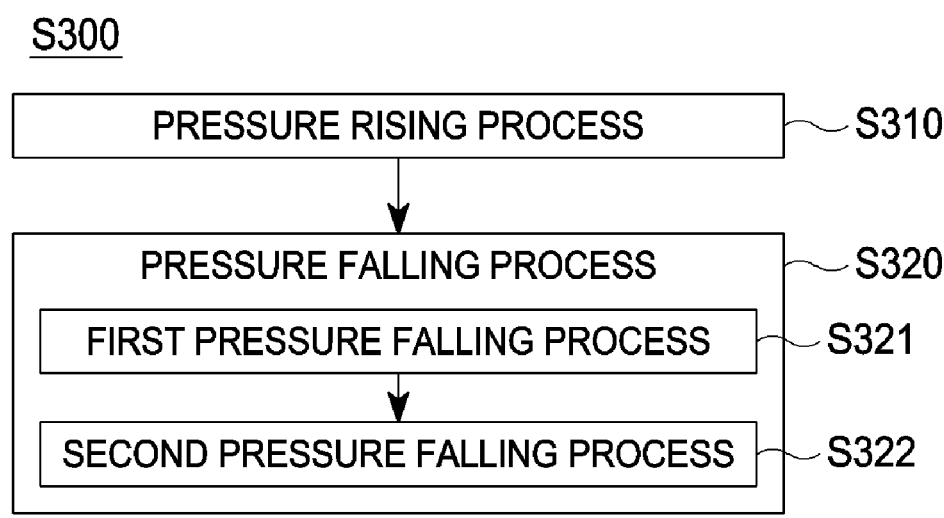
FIG. 11 is a flowchart illustrating a substrate processing process of the substrate processing method of FIG. 10.
Figure 12:
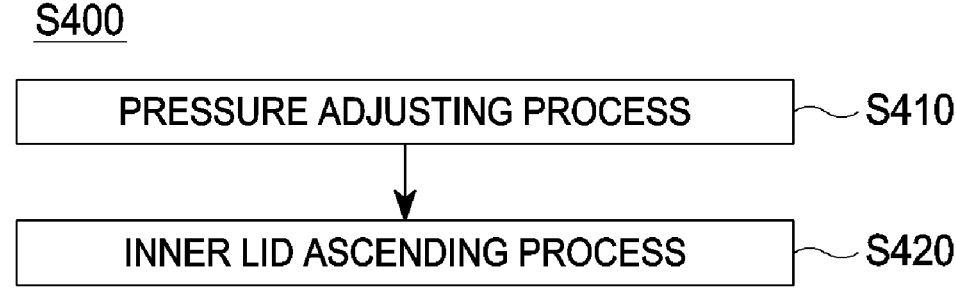
FIG. 12 is a flowchart illustrating a processing space releasing process of the substrate processing method of FIG. 10.

As illustrated in FIGS. 10 to 12, a the substrate processing method according to the present invention includes a substrate loading process (S100) of loading a substrate 1 into an inner space through a gate 111 by a transfer robot provided at the outside to seat the substrate 1 on a substrate support 200, a processing space forming process (S200) of allowing a portion of the inner lid part 300 to descend so as to be in close contact with a bottom surface 120 of the process chamber in a state in which the substrate 1 is seated on the substrate support 200 through the substrate loading process (S100), thereby dividing the inner space into a sealed processing space S2 and other non-processing space, and a substrate processing process (S300) of performing substrate processing on the substrate 1 disposed in the processing space S2.

In addition, the substrate processing method may further include, after the substrate is processed through the substrate processing process (S300), a processing space releasing process (S400) of allowing the inner lid part 300 to ascend so as to release the sealed processing space S2; and a substrate unloading process (S500) of unloading the processed substrate 1 by the transfer robot, which is disposed at the outside, from the inner space to the outside.

In addition, the substrate processing method may further include, before the substrate 1 is loaded into the inner space through the substrate loading process (S100), a cleaning process of supplying the process gas through a side of the processing space S2 in the state in which the inner lid part 300 ascends to exhaust the process gas through a side of the non-processing space S1.

The substrate loading process (S100) may be a process of loading the substrate 1 into the inner space through the gate 111 by the transfer robot provided at the outside to seat the substrate 1 on the substrate support 200 and may be performed through various methods.

That is, in the substrate loading process (S100), the substrate 1 to be processed may be loaded into the internal space through the external transfer robot and seated on the substrate support 200, thereby preparing the processing for the substrate 1.

For example, the substrate loading process (S100) may include, before the loading process, a loading pin-up process of allowing substrate support pins 810 to ascend to an upper side of the substrate support 200 in a state in which the inner lid part 300 ascends.

In addition, the substrate loading process (S100) may include a loading process of loading the substrate 1 into the inner space through the gale 111 by the transfer robot provided at the outside to support the substrate 1 on the ascending substrate support pins 810 and a loading pin-down process of allowing the substrate support pins 810 supporting the substrate to descend, thereby seating the substrate 1 on the substrate support 200.

The loading pin-up process may be a process of allowing the substrate support pins 810 to ascend to an upper side of the substrate support 200 in the state in which the inner lid part 300 ascends, i.e., in the state in which the processing space S2 is released.

In this case, in the loading pin-up process, the substrate processing may be repeatedly performed on the plurality of substrates 1. When the substrate 1 is loaded initial one time, thereafter, the substrate 1 on which the substrate process is completed may have to be unloaded in the state in which an unload according to an unloading pin-up process to be described later, and then, the loading process may be immediately followed and thus may be omitted.

As a result, the loading pin-up process may be performed in a situation in which the substrate 1 is initially loaded into the substrate processing apparatus and may be omitted thereafter.

The loading process may be a process of loading the substrate 1 into the inner space through the gate 111 by the transfer robot provided at the outside to support the substrate through the substrate support pins 810.

More specifically, in the loading process, in the state in which the substrate 1 supported by the transfer robot provided at the outside is loaded into the inner space through the gate 111, the transfer robot may descend to support the substrate 1 on the substrate support pins 810, and the external robot may be carried out of the internal space S1.

For another example, in the state in which the substrate 1 supported by the transfer robot provided at the outside is loaded into the inner space through the gate 111, the substrate support pins 810 may ascend to support the substrate 1 on the substrate support pins 810, and the external robot may be carried out.

In the loading pin-down process, the substrate support pins 810 supporting the substrate 1 may descend to allow the substrate support 200, more particularly, the substrate support pines 810 to be inserted into a substrate support plate 210 so that the substrate 1 is seated on a top surface of the substrate support plate 210.

The processing space forming process (S200) may be a process of allow an inner lid part 300 to descend so that a portion of the inner lid part 300 is in close contact with a bottom surface 120 of the process chamber 100 in the state in which the substrate 1 is seated on the substrate support 200 through the substrate loading process (S100), thereby dividing the inner space into the sealed processing space S2 and other non-processing space S1 and may be performed through various methods.

For example, in the processing space forming process (S200), the inner lid part 300 may descend in the state in which the substrate 1 is seated on the substrate support 200 to allow the bottom surface 120 and an edge of the process chamber 100 to be in close contact with each other, thereby forming the sealed processing space S2. Here, to form the sealed processing space S2, a sealing part 320 of the inner lid part 300 may be in close contact with the bottom surface 120.

As a result, in the processing space forming process (S200), the sealed processing space S2 may be separately formed to be separated from the inner space, and in the state in which the substrate 1 is disposed therein, a volume of the processing space S2 may be formed to be minimized.

Furthermore, in the processing space forming process (S200), the inner lid part 300 may descend to allow the inner space to be in close contact with a portion of the bottom surface 120 of the process chamber 100, and thus, the inner space may be divided into the sealed processing space S2 and other non-processing space S1.

Thus, the limitation in which the substrate processing is performed in the state in which the inner space is formed at a high pressure according to the related art, and thus, the gate valve is damaged may be prevented from occurring. In addition, a kind of buffer space may be formed in the non-processing space S1 between the processing space S2 and the gate valve to prevent the gate valve from being damaged even in the high-pressure substrate processing.

The substrate processing process S300 may be a process of performing the substrate processing on the substrate 1 disposed in the processing space S2 and may be performed through various methods.

In this case, in the substrate processing process (S300), the process gas may be supplied into the sealed processing space S2 through the gas supply part 400 to adjust and control a pressure within the processing space S2.

Particularly, in the substrate processing process (S300), as illustrated in FIG. 17, a pressing process of rising the pressure of the processing space S2 through the process gas, and a decompression process of falling the pressure of the processing space S2 after the pressing process may be performed.

Here, in the substrate processing process (S300), the pressure may increase to a pressure higher than the normal pressure, for example, a high pressure of about 5 bars, and the pressure may be decrease to a pressure lower than the normal pressure, for example, a low pressure of about 0.01 torrs.

In this case, in the substrate processing process (S300), the pressing process and the decompression process may be repeatedly performed within a short time.

More specifically, the substrate processing process (S300) may include a pressure rising process (S310) of raising a pressure in the processing space S2 to a first pressure higher than a normal pressure, and a pressure falling process (S320) of falling the pressure of the processing space S2 from the first pressure to a second pressure.

In addition, in the substrate processing process (S300), the pressure rising process (S310) and the pressure falling process (S320) may be repeatedly performed several times as one unit cycle, thereby performing repeated pressure change in the processing space S2.

In this case, the second pressure may be a pressure lower than the normal pressure, and the first pressure may be a pressure higher than the normal pressure.

The pressure falling process (S320) may include: a first pressure falling process (S321) of falling the pressure of the processing space S2 from the first pressure to the normal pressure, and a second pressure falling process (S322) of falling the pressure of the processing space S2 from the normal pressure to the second pressure lower than the normal pressure.

Thus, in the pressure falling process (S320), the pressure may be decrease step by step through the first pressure falling process (S321) of falling the pressure of the processing space S2 from the first pressure, which is higher than the normal pressure, to the normal pressure, and the second pressure falling process (S322) of falling the pressure of the processing space S2 from the normal pressure to the second pressure lower than the normal pressure.

In addition, in the substrate processing process (S300), the pressure of the non-processing space S1 may be constantly maintained at a vacuum pressure lower than the normal pressure during the pressure change process in the processing space S2.

The processing space releasing process (S400) may be a process of releasing the sealed processing space S2 by allowing the inner lid part 300 to ascend after the substrate processing through the substrate processing process (S300) and may be performed through various methods.

Here, in the processing space releasing process (S400), the inner lid part 300 may ascend through the above-described inner lid driving part 600 to release the contact with the bottom surface 120 of the process chamber 100 so that the inner space and the processing space S2 communicate with each other, thereby releasing the sealed processing space S2.

In this case, when the inner lid part 300 ascends in the state in which the pressure difference between the processing space S2 and the non-processing space S1 is large, durability of the substrate 1 may be damaged due to the pressure difference between the two spaces, and thus, it is necessary to minimize the pressure difference between the two spaces.

For this, the processing space releasing process (S400) may include: a pressure adjusting process (S410) of adjusting a pressure of at least one of the non-processing space S1 or the processing space S2 to adjust a pressure difference between the non-processing space S1 and the processing space S2 to a pressure below a preset range; and an inner lid ascending process (S420) of allowing the inner lid part 300 to ascend so as to release the processing space S2.

Here, in the pressure adjusting process (S410), the pressure of the non-processing space S1 may be adjusted through an exhaust part (not shown) for exhausting the gas supply part 400 or the processing space S2 to reduce the pressure difference between the processing space S2 and the non-processing space S1. Alternatively, the gas may be injected into the non-processing space S1 to reduce the pressure difference between the processing space S2 and the non-processing space S1 to a predetermined level or less.

In this case, in the pressure adjusting process (S410), a process of adjusting at least one pressure of the processing space S2 and the non-processing space S1 may be performed so that the pressure difference between the processing space S2 and the non-processing space S1 has a value within a predetermined range.

Particularly, when the inner lid part 300 ascends in the high-pressure processing space S2 and the vacuum non-processing space S1, a limitation in which slip of the substrate 1 occurs due to the large pressure difference between the spaces may occur. Thus, the inner lid part 300 may ascend in the state in which the pressures therebetween are adjusted to be the same.

The substrate unloading process (S500) may be a process of unloading the substrate 1, on which the substrate processing is completed, from the inner space to the outside through the gate 111 by the transfer robot provided at the outside and may be performed through various methods.

That is, in the substrate unloading process (S500), the processed substrate 1 may be transferred from the substrate support 200 through the external transfer robot and unloaded from the internal space.

For example, the substrate unloading process (S500) may include an unloading pin-up process of allow the substrate support pins 810 to ascend so that the substrate 1 seated on the substrate support 200 is spaced upward from the substrate support 200, thereby supporting the substrate support pin 810 and a unloading process of unloading the substrate 1, on which the substrate processing is completed, from the inner space to the outside through the gate 111 by the transfer robot provided at the outside.

In addition, the substrate unloading process (S500) may further include an unloading pin-down process of allow the substrate support pins 810 to descend into the substrate support 200 after the unloading process to be described later.

The unloading pin-up process may be a process of allowing the substrate support pins 810 to ascend to an upper side of the substrate support 200 in a state in which the inner lid part 300 ascends, i.e., in a state in which the processing space S2 is released.

Thus, in the unloading pin-up process, the processed substrate 1 seated on a top surface of the substrate support 200 may move and be exposed upward from the substrate support plate 210 so that the substrate 1 is supported to be spaced upward from the substrate support plate 210.

An unloading process may be a process of unloading the substrate 1 on which the substrate processing is completed by the transfer robot provided at the outside from the inner space through the gate 111 to the outside.

More specifically, in the unloading process, the substrate 1 supported by the substrate support pins 810 may be supported by the transfer robot introduced into the inner space through the gate 111, and the supported substrate 1 may be unloaded to the outside.

For this, in the unloading process, the transfer robot may be disposed below the substrate 1 in the state where the processed substrate 1 is supported by the substrate support pins 810, and the transfer robot may ascend to allow the transfer robot to support the substrate 1.

For another example, in the unloading process, the transfer robot may be disposed below the substrate 1 in the state in which the processed substrate 1 is supported by the substrate support pins 810, and the substrate support pins 810 may descend to allow the substrate 1 to be disposed on the transfer robot.

As described above, as the transfer robot moves to the outside through the gate 111 in the state in which the substrate 1 is supported by the transfer robot, the substrate 1 on which the substrate processing is completed may be unloaded.

In the unloading pin-down step, the substrate support pins 810 supporting the substrate 1 may descend to insert the substrate support pins 810 into the substrate support 200, more specifically, the substrate support plate 210.

Here, the unloading pin-down process may be performed after the substrate processing for the plurality of substrates 1 is repeatedly performed, and may also be performed after the last one substrate is unloaded. Previously, since it is necessary to maintain the state in which the substrate support pins 810 ascend to perform the above-described loading process, and thus, it may be omitted.

As a result, the unloading pin-down process may be performed in a situation in which the last substrate 1 is unloaded from the substrate processing apparatus, or in a situation in which the substrate processing apparatus is maintained and repaired in the middle.

The above-described substrate loading process (S100), the processing space forming process (S200), the substrate processing process (S300), the processing space releasing process (S400), and the substrate unloading process (S500) may be sequentially and repeatedly performed several times in one cycle (S10), and thus, one cycle may be performed to correspond to one substrate 1.

For another example, the substrate processing method according to the present invention may include, after the processing space forming process (S200), a gate closing process of closing the gate 111 through the gate valve 150 to seal the inner space.

In addition, the substrate processing method according to the present invention may further include, before the substrate loading process (S100), a gate opening process of opening the gate 111 through the gate valve 150.

In addition, the substrate processing method according to the present invention may further include, after the processing space releasing process (S400), a gate opening process of opening the gate 111 through the gate valve 150.

In addition, the substrate processing method according to the present invention may further include, after the loading process (S500), a gate closing process of closing the gate 111 through the gate valve 150.

The gate closing process may be a process of closing the gate 111 through the gate valve 150 to seal the inner space.

Here, in the gate closing process, the inner space may be sealed after the processing space forming process (S200). In this case, for another example, before the processing space forming process (S200) and after the substrate loading process (S100), the gate closing process may be performed.

That is, in the substrate processing method according to the present invention, since the processing space S2 is selectively formed separately in the internal space as necessary, the closing of the gate 111 through the gate valve 150 may be performed independently of the formation of the processing space S2.

That is, according to the formation of the processing space S2 of the inner lid part 300, the closing of the gate 111 through the gate valve 150 may be performed as necessary.

The gate closing process of closing the gate 111 through the gate valve 150 may be performed for a separate pressure control of the internal space and may be performed after the processing space forming process (S200).

In addition, the gate closing process may be performed to close the gate 111 after the unloading process S500. In this case, the gate closing process may be omitted in the process of repeatedly performing the substrate processing on the plurality of substrates 1 and may be performed only when the substrate processing is completely performed on the last substrate, or only when the maintenance and repair of the substrate processing apparatus are required.

The gate opening process may be a process of opening the gate 111 through the gate valve 150.

In this case, in the gate opening process, the opening of the inner space may be performed after the processing space releasing process (S400), and in this case, for another example, before the processing space releasing process (S400) and after the substrate processing process (S300), the gate closing process may be performed.

Thus, the gate opening process may be performed before the substrate unloading process (S500), and thus, the substrate 1 on which the substrate processing is completed may be unloaded to the outside.

In addition, the gate opening process may be performed to open the gate 111 before the substrate loading process S100. In this case, the gate opening process may be omitted in the process of repeatedly performing the substrate processing on the plurality of substrates 1 and may be selectively performed only when the initial substrate is loaded, or only when the maintenance and repair of the substrate processing apparatus are required.

The cleaning process may be a process of supplying the gas through a side of the processing space S2 in the state in which the inner lid part 300 ascends to exhaust the gas through a side of the non-processing space before the substrate 1 is loaded into the inner space through the substrate loading process.

More specifically, the cleaning process may be a process of cleaning the inner space S1 including the processing space S2 in which the substrate processing is performed before loading the substrate 1 into the inner space through the substrate loading process (S100), and after unloading the substrate 1 from the inner space through the substrate unloading process (S500).

Here, in the cleaning process, the exhaust may be performed through a gas exhaust port (not shown) at a side of the non-processing space S1, and a cleaning gas may be injected through the gas supply part 400 at a side of the processing space, and thus, a purge gas may be discharged through the gas exhaust port of the non-processing space S1 via the processing space S2.

That is, in this case, the gas may mean various types of gases such as the process gas for the substrate processing, the cleaning gas for cleaning the inside of equipment, and the purge gas for purging the internal space. Here, the cleaning gas may be injected through the processing space-side gas supply part 400, and the purge gas may be discharged through the gas exhaust port of the non-processing space S1.

Therefore, in the cleaning process, a flow of the cleaning gas may be induced from the processing space S2 to the non-processing space S1 to more completely clean the inner space, particularly an area corresponding to the processing space S2.

The substrate processing apparatus according to the present invention may minimize the volume of the processing space in which the substrate inside the chamber is processed to improve the pressure change rate in the wide pressure range, and thus, the pressure may be changed at the high pressure rate of about 1 Bar/s from the low pressure of about 0.01 Torrs to the high pressure of about 5 Bars.

In addition, the substrate processing apparatus according to the present invention may have the advantage of reducing the dead volume and minimizing the volume by omitting the installation of the separate gas supply part at the position adjacent to the substrate support as the process gas is injected upward from the substrate support.

In addition, the substrate processing apparatus according to the present invention may have the advantage in that, as the process gas is injected toward the substrate from the upper side of the substrate support, the process gas may be smoothly supplied toward the edge of the substrate as well as the central side of the substrate, to realize the uniform substrate processing.

In addition, the substrate processing apparatus according to the present invention may have the advantage in that, as the kind of buffer space of the non-processing space is defined between the processing space and the outer space of the process chamber, the harmful substances such as the process gas of the processing space is prevented from leaking to the outside of the process chamber, thereby improving the safely in the substrate processing.

In addition, the substrate processing apparatus according to the present invention may have the advantage in that the non-processing space is defined between the processing space and the outer space of the process chamber, and the pressure of the non-processing space is controlled to prevent the impurities from being introduced into the processing space, thereby improving the quality in the substrate processing.

In addition, the substrate processing apparatus according to the present invention may have advantages in that the exhaust of the processing space is dualized according to the pressure to improve the exhaust efficiency of the processing space, thereby improving the durability of the components of the apparatus.

In addition, the substrate processing apparatus according to the present invention may have the advantage in that, while minimizing the volume of the processing space in which the substrate is processed inside the process chamber, the substrate is transferred to be loaded into and unloaded from the process chamber, furthermore, the processing space.

The substrate processing apparatus according to the present invention may have the advantage of minimizing the volume of the processing space in which the substrate is processed, to improve the pressure change rate in the wide pressure range, thereby enabling the precise temperature control in response to the temperature change of the substrate.

Particularly, the substrate processing apparatus according to the present invention has the advantage of improving the process effect and forming the uniform film quality by controlling the temperature of the substrate to be constantly maintained even in the case of the temperature change factor caused by the sudden change in pressure.

In addition, since the substrate processing apparatus according to the present invention may have the advantage of directly performing the heating or cooling at the upper side that corresponds to the substrate processing surface so that the temperature compensation is fast to quickly and precisely control the temperature of the substrate.

Although the above description merely corresponds to some exemplary embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. A substrate processing apparatus comprising:
a process chamber that has an inner space and in which an installation groove is formed at a central side on a bottom surface;
a substrate support inserted into the installation groove and having a top surface on which the substrate is seated;
an inner lid part installed to be movable vertically in the inner space and descends such that a portion is in close contact with the bottom surface adjacent to the installation groove to divide the inner space into a sealed processing space and other non-processing space; and
an inner lid driving part installed through an upper portion of the process chamber to drive the vertical movement of the inner lid part;
wherein the inner lid part comprises an inner lid movable vertically in the inner space and a gas supply passage provided to communicate with the processing space inside the inner lid;
wherein the process chamber comprises a gas introduction passage provided to transfer the process gas introduced from outside the process chamber to a bottom surface in contact with the inner lid part; and
wherein the inner lid part is configured to descend to close contact with the bottom surface to connect the gas introduction passage to the gas supply passage, thereby supplying the gas supply passage with the process gas introduced through the gas introduction passage.

2. The substrate processing apparatus of claim 1, further comprising a gas supply part disposed below the inner lid part to inject the process gas transferred through the gas supply passage to the processing space.

3. The substrate processing apparatus of claim 2, wherein the gas supply part comprises an injection plate disposed below the inner lid part and provided with a plurality of injection holes.

4. The substrate processing apparatus of claim 3, wherein the gas supply part comprises an injection plate support configured to support an edge of the injection plate and coupled to a bottom surface of the inner lid part.

5. The substrate processing apparatus of claim 3, wherein the injection plate is disposed to be spaced downward from the inner lid part such that a diffusion space, into which the process gas is diffused, is defined between the injection plate and the inner lid part.

6. The substrate processing apparatus of claim 2, wherein the inner lid comprises an insertion installation groove, into which at least a portion of the gas supply part is inserted and installed, in a bottom surface thereof.

7. The substrate processing apparatus of claim 6, wherein the gas supply part has a bottom surface in a plane with the bottom surface of the inner lid and installed in the insertion installation groove.

8. The substrate processing apparatus of claim 1, wherein the inner lid comprises a gas introduction groove connected to an end of the gas supply passage at a central side of a bottom surface thereof.

9. The substrate processing apparatus of claim 1, wherein the gas supply passage comprises:
a vertical supply passage that is provided at a position corresponding to the gas introduction passage at the edge side of the inner lid and is connected to the gas introduction passage; and
a horizontal supply passage provided from the vertical supply passage toward a center of the inner lid.

10. The substrate processing apparatus of claim 1, further comprising:
a processing space pressure adjusting part communicating with the processing space and configured to adjust a pressure of the processing space;
a non-processing space pressure adjusting part communicating with the non-processing space and configured to adjust a pressure of the non-processing space independently of the processing space; and
a controller configured to control the pressure adjusting of the processing space and the non-processing space through the processing space pressure adjusting part and the non-processing space pressure adjusting part.

11. The substrate processing apparatus of claim 10, wherein the processing space pressure adjusting unit comprises:
a gas supply part configured to supply the process gas to the processing space; and
a gas exhaust part configured to exhaust the processing space, and
the non-processing space pressure adjusting part comprises:
a non-processing space gas exhaust part connected to a gas exhaust port provided on one surface of the process chamber to exhaust the non-processing space; and a non-processing space gas supply part connected to a gas supply port provided on the other surface of the process chamber to supply a filling gas to the non-processing space.

12. The substrate processing apparatus of claim 10, wherein the controller controls, before the inner lid part ascends, at least one of the processing space pressure adjusting part or the non-processing space pressure adjusting part such that the pressures of the processing space and the non-processing space are the same.

13. The substrate processing apparatus of claim 10, wherein the controller changes the pressure of the processing space, in which the substrate is seated to perform the substrate processing, between a first pressure higher than a normal pressure and a second pressure lower than the normal pressure through the processing space pressure adjusting part.

14. The substrate processing apparatus of claim 1, further comprising a temperature adjusting part installed in the inner lid part to adjust a temperature of the substrate disposed in the processing space.

15. The substrate processing apparatus of claim 1, wherein the substrate support comprises:

a substrate support plate on which the substrate is seated on a top surface;

a substrate support post passing through the bottom of the installation groove to connect to the substrate support plate; and an internal heater installed inside the substrate support plate.

16. The substrate processing apparatus of claim 14, wherein the temperature adjusting part comprises:

a temperature adjusting plate installed in the inner lid part to heat or cool the substrate; and a rod part passing through the top lid to couple to the temperature adjusting plate.

17. The substrate processing apparatus of claim 16, wherein the temperature adjusting part further comprises a buffer plate coupled to the through-hole below the inner lid part and configured to cover the temperature adjusting plate.

18. The substrate processing apparatus of claim 16, wherein the temperature adjusting plate comprises at least two temperature adjusting areas separated from each other on a plane and are independently adjustable in temperature with respect to each other.

19. The substrate processing apparatus of claim 14, further comprises a temperature controller configured to control heating or cooling of the temperature adjusting part, wherein the temperature controller controls the temperature adjusting part such that the temperature of the substrate or the processing space is constantly maintained while a pressure of the processing space is changed.

* * * * *